(12) United States Patent
Tibuleac et al.

(10) Patent No.: US 11,290,190 B2
(45) Date of Patent: Mar. 29, 2022

(54) METHOD AND APPARATUS FOR AUTOMATIC SIGNAL GAIN SETTING

(71) Applicant: ADVA Optical Networking SE, Meiningen OT Dreissigacker (DE)

(72) Inventors: Sorin Tibuleac, Johns Creek, GA (US); Steven Searcy, Atlanta, GA (US)

(73) Assignee: ADVA OPTICAL NETWORKING SE, Meiningen-Dreissigacker (DE)

(*) Notice: Subject to any disclaimer, the term of this patent is extended or adjusted under 35 U.S.C. 154(b) by 1155 days.

(21) Appl. No.: 15/827,928

(22) Filed: Nov. 30, 2017

(65) Prior Publication Data

US 2019/0165861 A1    May 30, 2019

(51) Int. Cl.

| | | |
|---|---|---|
| *H01S 3/00* | (2006.01) | |
| *H04B 10/294* | (2013.01) | |
| *H03G 3/30* | (2006.01) | |
| *H04J 14/02* | (2006.01) | |

(Continued)

(52) U.S. Cl.
CPC ....... *H04B 10/2942* (2013.01); *H03G 3/3042* (2013.01); *H03G 3/3084* (2013.01); *H04J 14/0221* (2013.01); *H01S 3/10015* (2013.01); *H01S 2301/04* (2013.01); *H04B 10/6931* (2013.01)

(58) Field of Classification Search
CPC ............... H03G 3/3042; H03G 3/3084; H04B 10/2942; H04B 10/6931; H04J 14/0221; H01S 2301/04; H01S 2301/02; H01S 3/10015; H01S 3/13013

See application file for complete search history.

(56) References Cited

U.S. PATENT DOCUMENTS

| | | |
|---|---|---|
| 6,072,601 A | 6/2000 | Toyohara |
| 6,904,438 B2 | 6/2005 | Harris et al. |
| 7,242,863 B2 | 7/2007 | DeGrange, Jr. |

(Continued)

FOREIGN PATENT DOCUMENTS

| | | | |
|---|---|---|---|
| DE | 19535801 C1 | | 9/1996 |
| JP | 2001144692 A | * | 5/2001 |
| WO | WO 2014/177224 A1 | | 11/2014 |

OTHER PUBLICATIONS

Communication of the partial European search report for European Patent Application Serial No. 18195940.4 (dated Mar. 20, 2019).

(Continued)

*Primary Examiner* — Mark Hellner
(74) *Attorney, Agent, or Firm* — Jenkins, Wilson, Taylor & Hunt, P.A.

(57) ABSTRACT

An apparatus for automatic amplifier gain setting of an optical amplifier, said apparatus comprising an optical channel counter, OCC, unit configured to detect a number of channels present in an optical transmission spectrum; a determination unit configured to determine an average power per channel calculated by dividing a measured total power of a signal input and/or signal output of the optical amplifier by the number of channels detected by said optical channel counter, OCC, unit and a gain adjustment unit configured to adjust the amplifier gain of said optical amplifier automatically depending on a calculated power difference between a predetermined desired power per channel and the determined average power per channel provided by said determination unit.

19 Claims, 13 Drawing Sheets

(51) Int. Cl.
 *H01S 3/10* (2006.01)
 *H04B 10/69* (2013.01)

(56) References Cited

U.S. PATENT DOCUMENTS

| | | | |
|---|---|---|---|
| 7,606,488 B2* | 10/2009 | Sugaya | H04J 14/0221 |
| | | | 330/308 |
| 7,725,042 B2 | 5/2010 | Young et al. | |
| 7,912,370 B2 | 5/2011 | Nakamura | |
| 2002/0039226 A1* | 4/2002 | Murakami | H01S 3/06758 |
| | | | 359/337 |
| 2004/0240041 A1* | 12/2004 | Tian | H01S 3/06758 |
| | | | 359/337 |
| 2006/0203329 A1* | 9/2006 | Nishihara | H04B 10/2942 |
| | | | 359/337 |

OTHER PUBLICATIONS

Communication of the extended European Search Report for European Patent Application Serial No. 18195940.4 (dated Jul. 2, 2019).

* cited by examiner

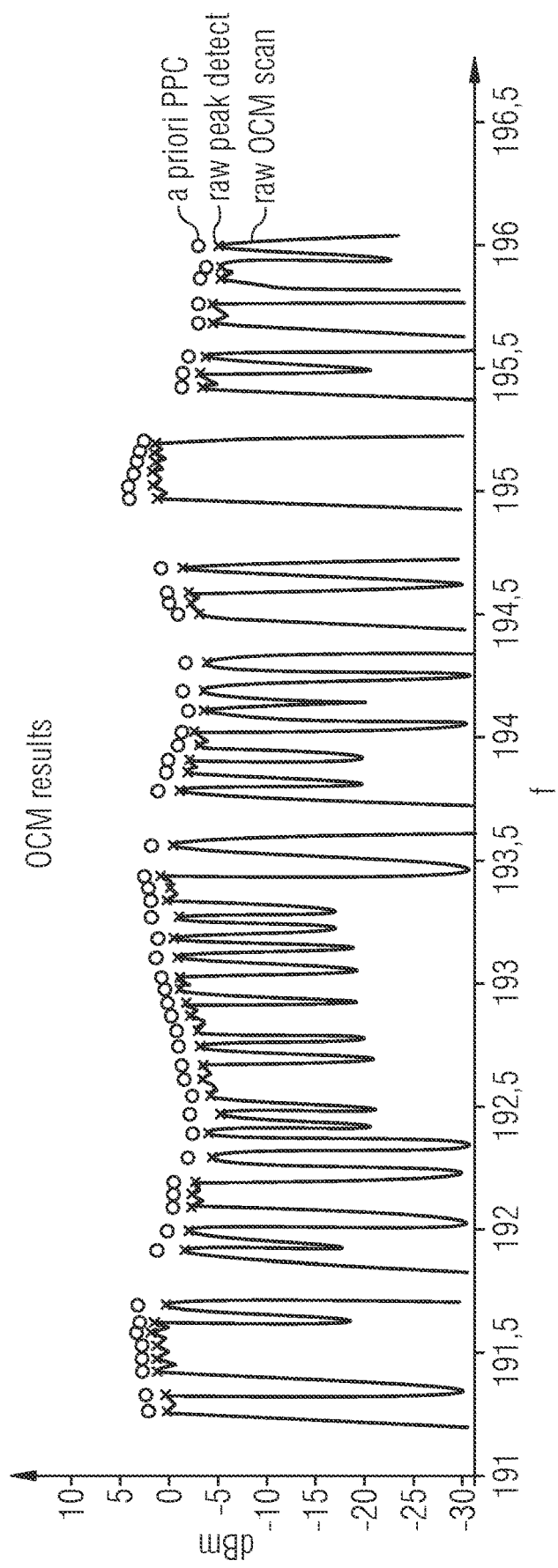

METHOD AND APPARATUS FOR AUTOMATIC SIGNAL GAIN SETTING

FIELD OF THE INVENTION

The invention relates to a method and apparatus for performing automatic signal gain setting and in particular a method for performing an automatic setting of an amplifier gain of an optical amplifier or an automatic setting of desired power levels into or out of a wavelength selective apparatus.

TECHNICAL BACKGROUND

In an optical system such as a wavelength division multiplexed system, it is necessary in many use cases to perform a gain setting of an optical amplifier. An amplifier gain of an optical amplifier can be automatically set based on measured or known system information. Other conventional methods generally rely on either highly detailed spectral measurement information and/or accurate per channel power detection. Alternatively, the method and system use extensive overhead signaling and communication using e.g. an optical supervisory channel OSC to track and control various optical system settings. U.S. Pat. No. 6,904,438 describes a method for tracking a WDM channel count using an optical supervisory channel overhead messaging to communicate between nodes. The communication includes information such as the number of channels to be added, dropped or passed through each OADM node of the optical network to determine the total WDM channel count. A drawback of this conventional method is that it relies on a complex overhead communication scheme which assumes a closed single-vendor WDM system. Accordingly, there is a need to provide a method and apparatus which provide an automatic signal gain setting of an optical system without requiring any overhead communication and which can also be used within a multi-vendor system.

SUMMARY OF THE INVENTION

The invention provides according to a first aspect an apparatus for automatic amplifier gain setting of an optical amplifier said apparatus comprising:
an optical channel counter, OCC, unit configured to detect a number of channels present in an optical transmission spectrum,
a determination unit configured to determine an average power per channel calculated by dividing a measured total power of a signal input and/or signal output of the optical amplifier by the number of channels detected by said optical channel counter, OCC, unit and
a gain adjustment unit configured to adjust the amplifier gain of the optical amplifier automatically depending on a calculated power difference between a predetermined desired power per channel and the determined average power per channel provided by said determination unit.

In a possible embodiment of the apparatus according to the first aspect of the present invention, the optical channel counter, OCC, unit comprises
a tunable wide bandwidth optical filter adapted to scan the optical transmission spectrum,
a photodetector adapted to detect a filter output of the tunable optical filter and
a processor adapted to process the detected filter output provided by the photodetector to count the number of channels present in the optical transmission spectrum.

In a possible embodiment of the apparatus according to the first aspect of the present invention, the tunable wide bandwidth optical filter has a bandwidth that is broad relative to the signal bandwidth and/or channel spacing between channels.

In a still further possible embodiment of the apparatus according to the first aspect of the present invention, a center frequency of the tunable wide bandwidth optical filter of said optical channel counter, OCC, unit is scanned in fixed frequency increments over the optical transmission spectrum and a filter output of the tunable wide bandwidth optical filter is detected and recorded at each frequency increment by the photodetector of said optical channel counter, OCC, unit.

In a further possible embodiment of the apparatus according to the first aspect of the present invention, the optical channel counter, OCC, unit receives a channel plan concerning channel spacings between channels within the optical transmission spectrum to decide whether a channel is present or not at a specific channel frequency slot of the optical transmission spectrum.

In a still further possible embodiment of the apparatus according to the first aspect of the present invention, the processor of the optical channel counter, OCC, unit is adapted to integrate power within each channel frequency slot indicated in the channel plan and to compare the integrated power with a power threshold value to decide whether a channel is present or not at the respective channel frequency slot.

In a still further possible embodiment of the apparatus according to the first aspect of the present invention, the channel plan is supplied to the processor of said optical channel counter, OCC, unit before scanning of the optical transmission spectrum by the tunable optical filter of said optical channel counter, OCC, unit is initiated.

In a still further possible embodiment of the apparatus according to the first aspect of the present invention, the processor of the optical channel counter, OCC, unit is adapted to apply a peak/channel detection algorithm to count the number of channels present in the optical transmission spectrum.

The invention further provides according to a second aspect an optical amplifier module comprising an optical amplifier configured to amplify an optical input signal with a gain to generate an optical output signal, and a gain setting apparatus configured to set automatically the gain of said optical amplifier,
said gain setting apparatus comprising:
an optical channel counter, OCC, unit configured to detect a number of channels present in an optical transmission spectrum using a tunable wide bandwidth optical filter,
a determination unit configured to determine an average power per channel calculated by dividing a measured total power of a signal input and/or signal output of the optical amplifier by the number of channels detected by the optical channel counter, OCC, unit and
a gain adjustment unit configured to adjust the amplifier gain of said optical amplifier automatically depending on a calculated power difference between a predetermined desired power per channel and the determined average power per channel provided by the determination unit.

The invention further provides according to a third aspect a multispan line system comprising cascaded optical amplifiers connected to each other via fiber spans, said multispan line system comprising an optical channel counter, OCC, unit configured to detect a number of channels present in an optical transmission spectrum of said multispan line system using a tunable wide bandwidth optical filter,
wherein the detected number of channels is communicated via an optical supervisory channel, OSC, to the cascaded optical amplifiers of the multispan line system.

In a possible embodiment of the multispan line system according to the third aspect of the present invention, each cascaded amplifier of the multispan line system comprises a determination unit configured to determine an average power per channel calculated by dividing a measured total power of a signal input and/or signal output of the optical amplifier by the number of channels detected by the optical channel counter, OCC, unit communicated via the optical supervisory channel, OSC, and
a gain adjustment unit configured to adjust the amplifier gain of said optical amplifier automatically depending on a calculated power difference between a predetermined desired power per channel and the determined average power per channel provided by the determination unit.

In a further possible embodiment of the multispan line system according to the third aspect of the present invention, an amplified spontaneous emission, ASE, power generated by each cascaded optical amplifier of the multispan line system is tracked and summed up to determine a cumulative amplified spontaneous emission, ASE, of the cascaded optical amplifiers.

In a further possible embodiment of the multispan line system according to the third aspect of the present invention, the cumulative amplified spontaneous emission, ASE, of the cascaded optical amplifiers is subtracted from a measured total power to determine a total power of the optical channels.

In a still further possible embodiment of the multispan line system according to the third aspect of the present invention, the determined total power of the optical channels is divided by the number of optical channels present in the optical transmission spectrum of the multispan line system provided by the optical channel counter, OCC, unit to calculate the average power per channel in said multispan line system.

In a further possible embodiment of the multispan line system according to the third aspect of the present invention, the multispan line system is a wavelength division multiplexed, WDM, multispan line system comprising a plurality of WDM channels in a predetermined frequency band.

As illustrated in FIG. 10, the invention further provides according to a fourth aspect a method for performing automatic setting of an amplifier gain of an optical amplifier, the method comprising the steps of:
detecting a number of channels present in an optical transmission spectrum using a tunable wide bandwidth optical filter (Step S1),
measuring a total power at a signal input and/or at a signal output of the optical amplifier (Step S2),
dividing the measured total power by the detected number of channels present in the optical transmission spectrum to calculate an average power per channel (Step S3),
calculating a power difference between a predetermined desired power per channel and the calculated average power per channel (Step S4), and
adjusting the amplifier gain of the optical amplifier depending on the calculated power difference (Step S5).

In a possible embodiment of the method according to the fourth aspect of the present invention, a center frequency of the tunable wide bandwidth optical filter is scanned in fixed frequency increments over the optical transmission spectrum and a filter output of said wide bandwidth optical filter is detected and recorded at each frequency increment.

In a possible embodiment of the method according to the fourth aspect of the present invention, the detected filter output of said wide bandwidth optical filter is processed by a processor to count the number of channels present in the optical transmission spectrum.

In a still further possible embodiment of the method according to the fourth aspect of the present invention, the processor is adapted to integrate power within each channel frequency slot indicated in a channel plan and to compare the integrated power with a power threshold value to decide whether a channel is present or not at the respective channel frequency slot.

In a still further possible embodiment of the method according to the fourth aspect of the present invention, the channel plan is supplied to the processor before scanning of the optical transmission spectrum by the tunable optical filter is initiated.

In a still further possible embodiment of the method according to the fourth aspect of the present invention, the processor is adapted to apply a peak/channel detection algorithm to count the number of channels present in the optical transmission system.

The invention further provides according to a fifth aspect a wavelength selective apparatus comprising:
an optical channel counter, OCC, unit configured to detect a number of channels present in an optical transmission spectrum using a tunable wide bandwidth optical filter and
a calculation unit configured to calculate an average signal power at ports of said wavelength selective apparatus based on a total power measurement and the number of channels detected by the optical channel counter, OCC, unit.

In a possible embodiment of the apparatus according to the fifth aspect of the present invention, the determination unit is configured to determine whether an average signal power on a given port of said wavelength selective apparatus meets predetermined thresholds on the basis of a measured total signal power within a predefined optical transmission spectrum.

In a further possible embodiment of the apparatus according to the fifth aspect of the present invention, the determination unit is configured to determine whether a signal power at one of the ports of the wavelength selective apparatus does not exceed a predetermined safety power threshold.

In a still further possible embodiment of the apparatus according to the fifth aspect of the present invention, a signal power at one or more ports of the wavelength selective apparatus is automatically adjusted by the wavelength selective apparatus or by another device to meet predetermined signal power thresholds at the respective ports of said wavelength selective apparatus.

The invention further provides according to a sixth aspect a method for automatic adjustment of signal power at one or more ports of a wavelength selective apparatus,
the method comprising the steps of:
detecting a number of channels present in an optical transmission spectrum by an optical channel counter, OCC, unit using a tunable wide bandwidth optical filter, determining whether an average signal power at the ports of the wavelength selective apparatus does meet predetermined power thresholds on the basis of the detected number of channels within the optical transmission spectrum and a measured total signal power within the optical transmission spectrum and adjusting the signal power at the ports of the wavelength selective apparatus until the signal power of the signal at the ports does meet the predetermined power thresholds.

BRIEF DESCRIPTION OF FIGURES

In the following, possible embodiments of the different aspects of the present invention are described in more detail with respect to the enclosed figures.

FIG. 20 shows an example of a blind channel counter operation with 37.5 GHz spaced channels which can be performed by a method and apparatus according to the present invention.

DETAILED DESCRIPTION OF EMBODIMENTS

Figure 1:
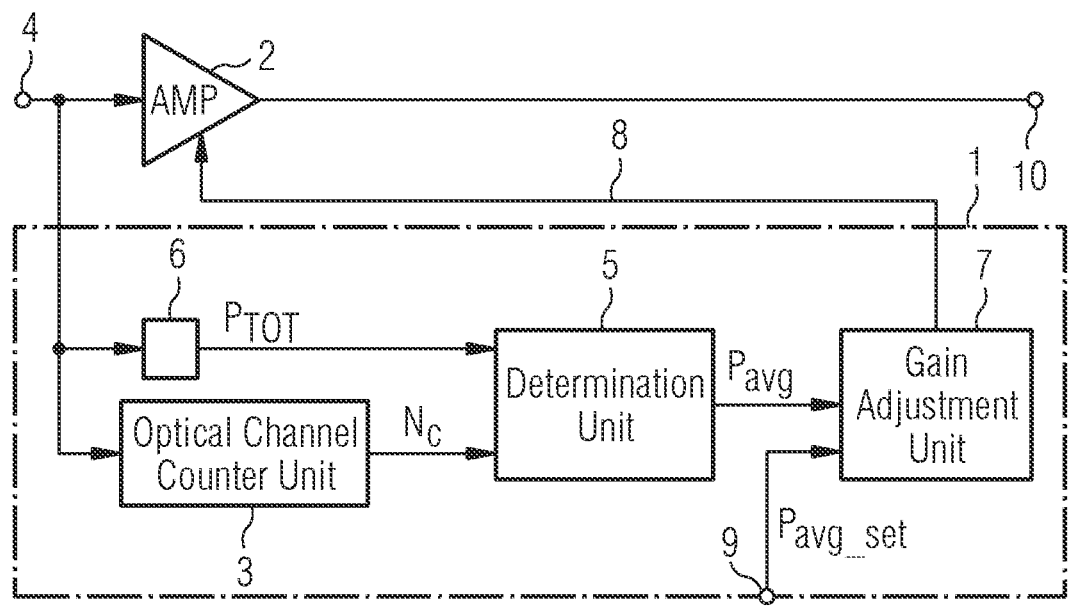
FIG. 1 shows a block diagram for illustrating a possible exemplary embodiment of an apparatus for automatic amplifier gain setting of an optical amplifier according to the first aspect of the present invention.

As can be seen in the block diagram of FIG. 1, an apparatus 1 for automatic amplifier gain setting of an optical amplifier 2 can comprise several main components or elements. The apparatus 1 comprises in the illustrated embodiment an optical channel counter, OCC, unit 3 connected to the signal input 4 of the signal amplifier 2. The signal input 4 of the amplifier 2 is directly connected to the input of the optical channel counter unit 3 as illustrated in FIG. 1. The optical channel counter, OCC, unit 3 of the apparatus 1 is configured to detect a number of channels present in an optical transmission spectrum at the signal input 4. The apparatus 1 further comprises a determination unit 5 configured to determine an average power per channel. The average power per channel $P_{AVG}$ is calculated by the determination unit 5 by dividing a measured total power $P_{TOT}$ at the signal input of the optical amplifier 2 by the number of channels $N_C$ detected by the optical channel counter unit 3. As illustrated in FIG. 1, the apparatus 1 can comprise a measurement unit 6 which measures the current total power at the signal input 4 of the optical amplifier 2 and supplies the value of the measured total power to the signal input 4 to the determination unit 5. The determination unit 5 receives the number of channels $N_C$ from the optical channel counter unit 3 and divides the value of the received total power $P_{TOT}$ by the number of channels $N_C$ to calculate the average power per channel. The calculated average power per channel is supplied by the determination unit 5 to a gain adjustment unit 7 of the apparatus 1 as illustrated in FIG. 1. The gain adjustment unit 7 is configured to adjust the amplifier gain of the optical amplifier 2 via a control signal line 8 as shown in FIG. 1. The amplifier gain of the optical amplifier 2 is adjusted automatically depending on a calculated power difference between a predetermined desired power per channel and the determined average power per channel provided by the determination unit 5. In a possible embodiment, the apparatus 1 comprises an input 9 to receive a predetermined desired power per channel which is supplied to the gain adjustment unit 7. The gain adjustment unit 7 can comprise a subtractor which calculates a power difference between the applied desired power per channel and the calculated average power per channel received from the determination unit 5. Depending on the calculated power difference, the gain adjustment unit 7 adjusts the signal gain of the optical amplifier 2 via the control line 8 as shown in FIG. 1. The amplified signal is output at signal port 10 as shown in FIG. 1.

Figure 2:
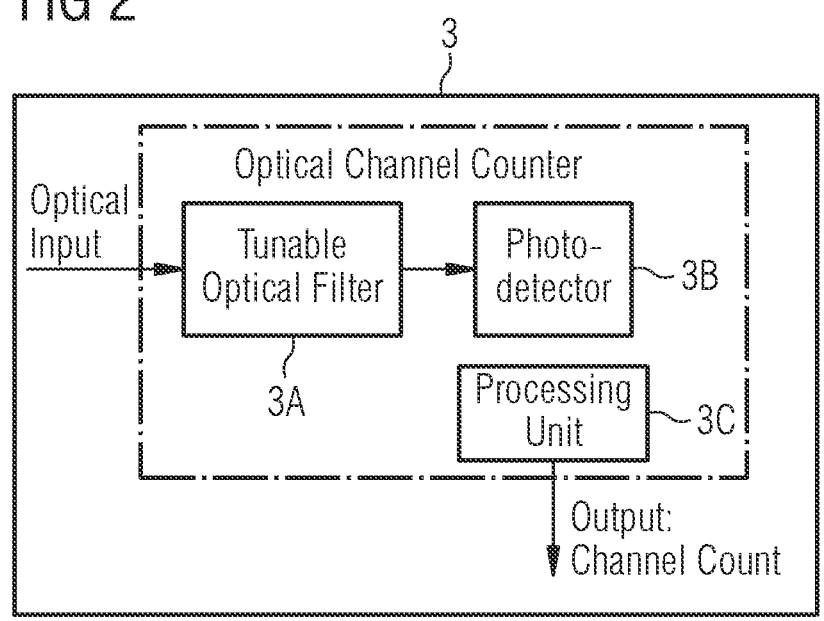
FIG. 2 shows a block diagram of a possible exemplary embodiment of an optical channel counter, OCC, unit which can be used within the apparatus as illustrated in FIG. 1.

FIG. 2 shows a block diagram of a possible exemplary embodiment of the optical channel counter unit 3 of the apparatus 1. In a possible embodiment, the optical channel counter unit 3 can comprise three main elements. The optical channel counter unit 3 comprises in a possible embodiment a tunable wide bandwidth optical filter 3A, a photodetector 3B and a processor 3C. The bandwidth BW of filter 3A can in a possible embodiment approximately correspond to the signal bandwidth and/or channel spacing between channels. The tunable wide bandwidth optical filter 3A is configured to scan the optical transmission spectrum of the optical input signal. The photodetector 3B is adapted to detect a filter output of the tunable optical filter 3A. The processing unit 3C is adapted to process the detected filter output provided by the photodetector 3B to count the number of channels $N_C$ present in the optical transmission spectrum of the received optical signal. The optical channel counter unit 3 can scan a center frequency of the tunable filter 3A across a full spectral occupancy range of the optical system, e.g. the C-band from 1530 to 1565 nm. The photodetector or photodiode 3B is provided to detect the optical power in certain frequency steps. The processing unit 3C of the OCC unit 3 can apply in a possible embodiment an algorithm to the filter scan output to detect the number of optical channels (carrier/wavelength) present in the input frequency spectrum. The optical channel counter, OCC, unit 3 has several advantages. It can be very small in size and is also simple to design and build. The optical channel counter, OCC, unit 3 does cost less than standard optical channel monitors (OCM) which attempt to accurately measure the power of individual channels. Its lower complexity and size does facilitate significantly the integration of the optical channel counter, OCC, unit 3 within any kind of optical amplifier module or within any wavelength division multiplexed, WDM, transceiver card. Accordingly, the optical channel counter, OCC, unit 3 as illustrated in FIG. 2 can be integrated into another module but can also form a standalone entity. A further advantage of the optical channel counter, OCC, unit 3 as illustrated in FIG. 2 resides in the fact that it does not require any calibration since the OCC unit 3 relies only on detecting a relative optical power across the optical spectrum rather than measuring an absolute optical power. This also makes it feasible to use an external standalone device for the optical channel counter, OCC, unit 3 since any fiber jumper connection to the line system can have some unknown amount of loss, thus introducing an error into an absolute optical power measurement. The tunable optical filter 3A can be used to detect the number of optical channels (wavelengths) present in the respective optical system. This system can then be used for automatically setting the gain of the optical amplifier 2 to achieve a target output optical power per channel. The optical power per channel at each optical amplifier 2 can be calculated by taking the total optical power as measured with the conventional photodetector 3B, and dividing it by the total number of optical channels received from the optical channel counter, OCC, unit 3 to determine an average power per channel PPC:

$$PPC_{Average} = Power_{Input,Total}/N_C$$

Once the input optical power per channel has been determined, the gain of the optical amplifier 2 can be set to achieve the desired output power per channel:

$$Gain = PPC_{Output,Desired} - PCC_{Input,Calc/Meas}$$

The above calculations can be based on determining or setting the average power per channel which is implicitly assuming that all channel powers are similar. This is a simplifying assumption which is generally true in most wavelength division multiplexed, WDM, systems, in particular DWDM systems, where all per channel power levels are equalized around a given average power level, only with some random and/or systemic per channel power deviations commonly known as channel power ripple around the average power per channel. The ripple magnitude does not impact the accuracy of the proposed method according to the first aspect of the present invention as long as the ripple distribution is approximately symmetric around the average power per channel, which is true in most WDM systems.

A further advantage of the apparatus 1 according to the first aspect of the present invention is that it is relatively robust to small errors in channel count. Since the gain calculation is based on deriving the power per channel from the total power and channel count, the calculated gain depends on the channel count accuracy. However, for optical systems with a large number of channels such as a WDM system with more than ten WDM channels as is in the case in many developed WDM systems, the impact of small errors in the channel count (error of one or two channels) on the PPC/gain calculation accuracy is small.

Figure 11:
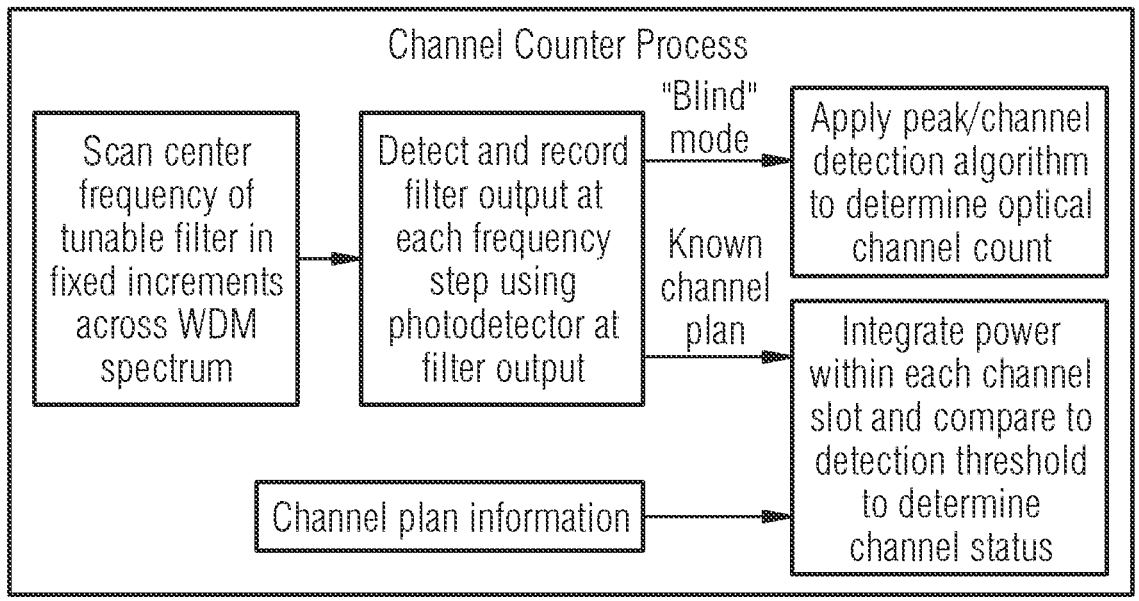
FIG. 11 illustrates a schematic diagram for illustrating a channel counter process used by the method according to the fourth aspect of the present invention.

The optical channel counter, OCC, unit 3 of the apparatus 1 can be implemented in multiple different ways as also illustrated in FIG. 11 illustrating a possible channel counter process performed by the optical channel counter, OCC, unit 3. In a possible embodiment, the tunable wide bandwidth optical filter 3A has a bandwidth that is broad relative to the signal bandwidth and/or channel spacing between the channels.

In a possible embodiment or implementation variant, the channel plan (grid/spacing) is unknown a priori, i.e. not known. In this variant, the optical channel counter, OCC, unit 3 operates in a blind fashion or mode as also illustrated in FIG. 11 to determine the number of channels within a flexible or variable channel plan. This implementation faces more stringent requirements on the bandwidth of the tunable filter 3A used in the optical channel counter, OCC, unit 3. The precise requirements depend on the spectral shape of the tunable filter transmission profile and the spectral shapes of the signals. The tunable optical filter 3A has in a possible embodiment a bandwidth no greater than 75% of the smallest channel bandwidth. This implementation can be used in any type of WDM system, in particular any kind of DWDM system, including elastic or dynamic systems with flexible-grid reconfigurable optical add/drop demultiplexers ROADMs where the bandwidth assigned to each WDM channel or group of channels on an optical path through a sequence of ROADMs can be selected by the user, or by an automated software component to provide most efficient use of the available signal spectrum.

In a second implementation variant of the apparatus 1 according to the first aspect of the present invention, the channel plan (grid/spacing) is known a priori. In this embodiment, the optical channel counter, OCC, unit 3 receives a channel plan concerning channel spacings between channels within the optical transmission spectrum to decide whether a channel is present or not at a specific channel frequency slot of the optical transmission spectrum. The channel grid and spacing information provided by the channel plan can be received from an external source by the optical channel counter, OCC, unit 3. The optical channel counter, OCC, unit 3 can operate using this knowledge or channel plan to detect a number of channels present across the fixed known channel grid. This implementation or embodiment can easily be applied to optical systems with fixed filters or fixed grid ROADMs, or to flexible/reconfigurable optical systems if the channel plan information of the channel plan is up-dated and provided to the processor 3C of the optical channel counter, OCC, unit 3 before scanning. It is of note that only the channel grid/spacing is required, not the specific optical signal types or bandwidths, even if there are mixed signal types within the optical system. The second variant based on the preknown fixed channel grid or channel plan can be implemented with a wider range of tunable optical filters since the bandwidth and filter shape requirements are less strict for the method and apparatus 1 to work with a good accuracy. Since this embodiment does not require an accurate per channel power measurement, but only a decision on whether or not a channel is present at a given spectral location, this opens the possibility to use much broader bandwidth tunable optical filters 3A. These kinds of broader bandwidth tunable optical filters 3A are less complex and cheaper than narrow tunable optical filters typically required for traditional or conventional optical channel monitor (OCM) devices, which do measure the absolute power per channel. In a possible embodiment the bandwidth of the tunable optical filters 3A can be twice as broad as the channel spacing. Such kinds of wideband optical filters 3A are commercially available for other applications in optical telecommunication systems, such as filtering out ASE noise from coherent transmitters with built-in amplification. Such kinds of optical wideband filters are generally not suitable for typical optical channel monitor (OCM) applications, but they are less complex and can be used advantageously in the method and apparatus according to the present invention. The less strict requirements with respect to the optical tunable filters 3A used in the optical channel counter, OCC, unit 3 can also be advantageous for use with combined C+L band systems spanning a wider spectral range for all the optical signals in the WDM system. Conventional OCM functionality for C+L band requires tighter specification for the tunable filter bandwidth and free spectral range, thus requiring separate devices for the C and L bands, or increasing the complexity and cost of a single OCM for C+L frequency band. In contrast, the method and apparatus 1 according to the present invention can be accomplished with a single device for channel count detection across the C+L band, which can be designed and manufactured at lower cost due to the relaxed requirements on the linewidth and free spectral range.

In a possible embodiment, the optical channel counter, OCC, unit 3 receives a predetermined channel plan from an information source via a data link. The processor 3C of the optical channel counter, OCC, unit 3 can be adapted to integrate power within each channel frequency slot indicated in the received channel plan and to compare the integrated power with a power threshold value to decide whether a channel is present or not at the respective channel frequency slot. The channel plan can be supplied to the processor 3C of the optical channel counter, OCC, unit 3 before scanning of the optical transmission spectrum by the tunable optical filter 3A of the optical channel counter, OCC, unit 3 has been initiated. In a possible embodiment, the processor 3C of the optical channel counter, OCC, unit 3 can apply a peak/channel detection algorithm to count the number of channels present in the optical transmission spectrum. As also illustrated in FIG. 11, the optical channel counter, OCC, unit 3 can be configured to perform a channel counter process in one of two operation modes. These operation modes can comprise a first operation mode where no channel plan is available and a second mode with an available known channel plan. In the channel counter process performed by the optical channel counter, OCC, unit 3, first a center frequency of the tunable optical filter is scanned in fixed increments across the transmission spectrum. Then, the filter output is detected and recorded at each frequency step using the photodetector 3B at the filter output of the tunable optical filter 3A. If the optical channel counter, OCC, unit 3 operates in the first operation mode, a peak channel detection algorithm can be applied to determine the optical channel count. In contrast, if the channel plan is known and the optical channel counter, OCC, unit 3 operates in the second operation mode, the power within each channel slot can be integrated and be compared to a predetermined detection threshold to determine the channel status of the respective channel. In a possible embodiment, the optical channel counter unit, OCC, unit 3 can be operated in both operation modes and be switched between the first blind operation mode and the second operation mode with a predetermined channel plan being available.

In a further possible implementation, the optical channel counter, OCC, unit 3 can also be used with amplifiers operating in a constant output power mode such as in a submarine system. In these use cases, when channels are added or dropped in a so-called dummy or loading channels (i.e. optical channels which do not carry data, such as an unmodulated laser source or spectrally-shaped ASE noise) they can be removed or inserted in spectral regions where WDM signals are absent in order to maintain a constant output power per channel. A fast scan performed by the optical channel counter, OCC, unit 3 can be used to identify and trigger updates to the system for managing these kinds of dummy/loading channels under changing WDM traffic conditions. The optical channel counter, OCC, unit 3 thus has a faster response time than a conventional OCM device.

In a possible embodiment, an etalon-based tunable optical filter can be used as the tunable optical filter 3A. An etalon-based tunable optical filter is commonly used for filtering out-of-band ASE noise from coherent transmitters which include an amplifier, such as in coherent CFP/CFP2 pluggable transceivers. As such, the etalon-based tunable filter has a very small footprint and can be manufactured with relatively low cost. Since the filter transmission profile has a −3 dB bandwidth of approximately 65 GHz and many distant side lobes, this tunable optical filter is not well-suited for conventional OCM applications which require narrow filter shapes. However, an etalon-based tunable optical filter can be effectively used with the method and apparatus 1 according to the present invention. An example of a full spectral profile of an exemplary tunable optical filter is illustrated in FIG. 16.

Figure 16:
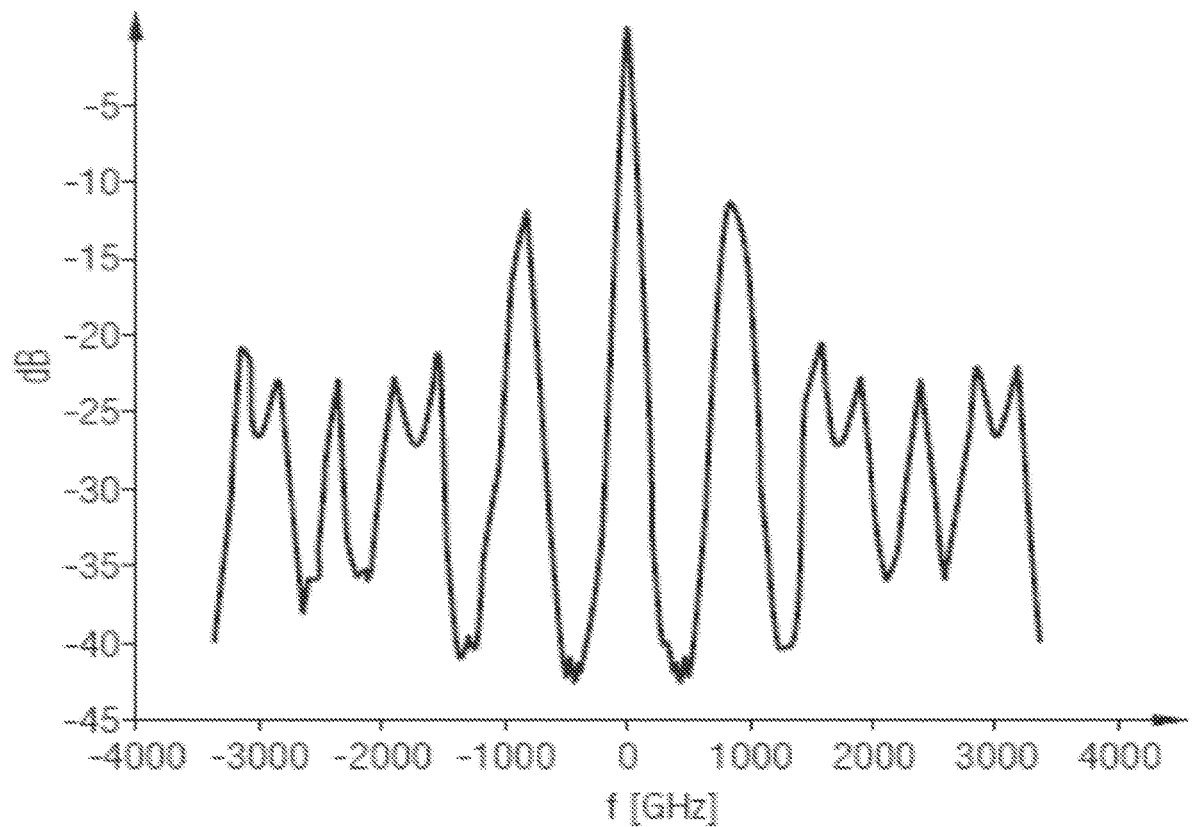
FIG. 16 illustrates an exemplary full spectral profile for a tunable filter which can be used by the method and apparatus according to the present invention.
Figure 17:
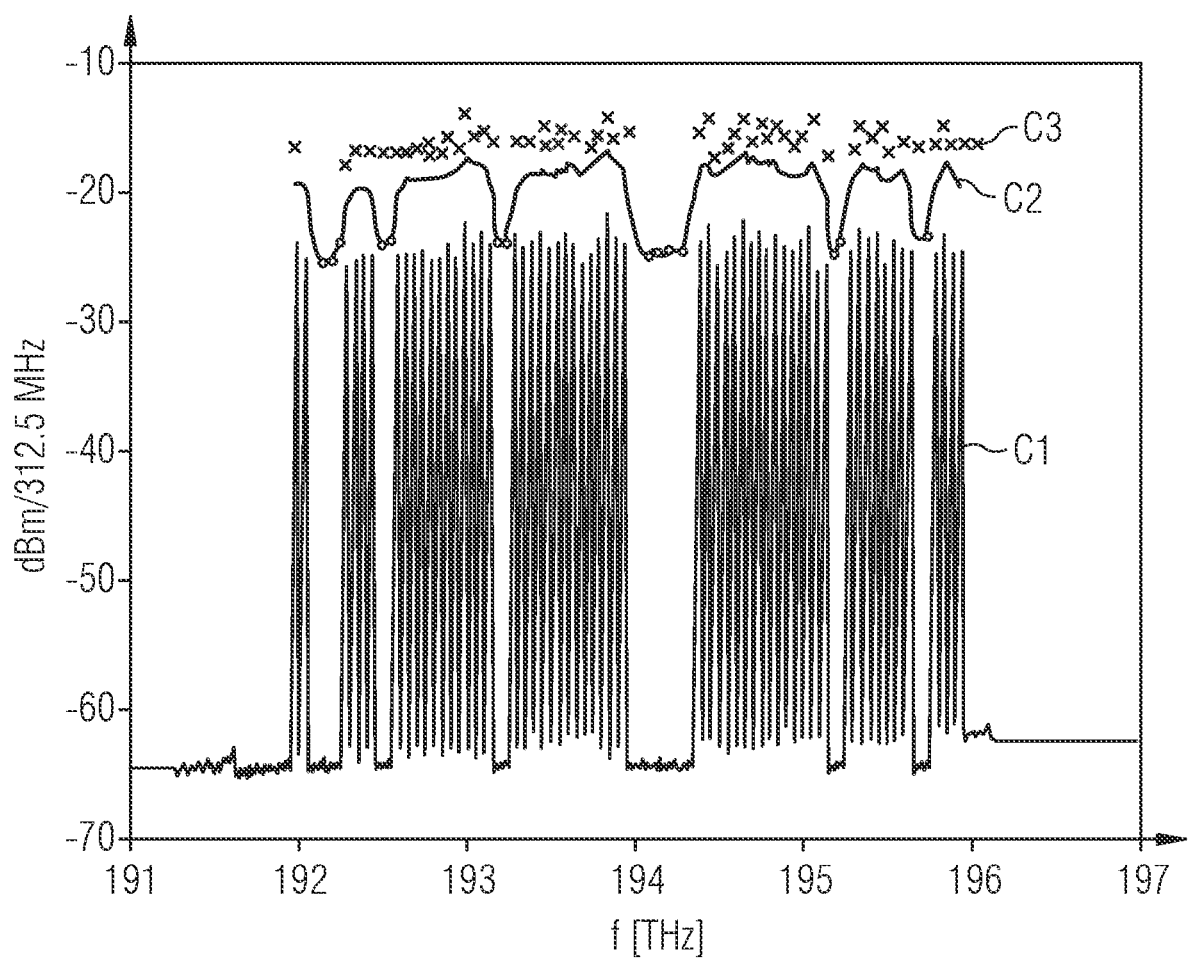
FIG. 17 shows a schematic diagram of an exemplary optical spectrum and optical channel counter operation which can be performed by a method and apparatus according to the present invention.

FIG. 16 shows an exemplary tunable filter transmission profile. A specific example is given with 56 Gb/sec optical signals with 4-level pulse amplitude modulation (PAM4). The exemplary optical spectrum consists of 60 channels/carriers/wavelengths and comprises a large but realistic random channel power ripple of 4 dB peak-to-peak deviation in channel power across the C-band. This 60-channel spectrum is illustrated in FIG. 17. FIG. 17 illustrates an exemplary optical spectrum and optical channel counter operation. The first curve C1 illustrated in FIG. 17 is the actual optical spectrum (measured in the given example with a high resolution of 312.5 MHz step size. The second curve C2 is the filter scan output with X/O markers indicating channels detected as present/absent. The X markers in the third curve C3 indicate actual power per channel values calculated from the high-resolution spectrum. A filter 3A having the filter shape of FIG. 16 and actual measured spectra as illustrated in FIG. 17 has −3 dB bandwidth BW of ~65 GHz. This exemplary filter works for a channel count detection with a filter bandwidth channel spacing ratio of ~1.3, even with realistic frequency offsets and power imbalance among the channels (~4 dB). The given example also shows how this parameter setup would fail if attempting to measure accurate per channel powers like a traditional OCM, even though it does work for a channel count detection according to the present invention.

The required filter bandwidth depends strongly on the channel spacing and also moderately on the spectral occupancy of the space within each channel slot. Narrower filters can be used for tighter channel spacings. Even more narrow filters are used for a given channel spacing if the signal more nearly fills the channel bandwidth.

In a possible embodiment for accurate channel count detection in a "blind" mode with unknown channel grid/channel plan a filter bandwidth of e.g. ~0.7-0.9× channel spacing can be used (e.g. for 32 Gbd signals @ 50 GHz spacing the required filter bandwidth can be around 37.5 GHz where filter bandwidth BW/channel spacing CH is around 0.75).

In a possible embodiment for accurate channel count detection given a fixed and known channel grid/channel plan a filter bandwidth of e.g. 1.5 to 2× channel spacing can be used (e.g. for 32 Gbd signals @ 50 GHz spacing the required filter bandwidth can be around 85 GHz where filter bandwidth BW/channel spacing CH is around 1.7).

The exemplary tunable filter profile can be scanned across a frequency band such as the C-band, wherein the filter center frequency can be set to the corresponding frequencies for each 50 GHz channel slot in a standard 80-wavelength DWDM channel plan. The resulting filter scan output is shown by curve C2 of FIG. 17 with the markers X or O corresponding to the detected filter output power values at each 50 GHz channel slot. A given channel is detected by the processing algorithm as present or active (X marker on curve C2) if the relative power value from the filter scan is within a certain threshold of the maximum detected power across all channel slots. In the illustrated example, the channel detection threshold is set to 5 dB below the maximum. In contrast, if the relative power at a given channel slot is below the detection threshold, then the respective channel is detected as absent or missing as indicated by the O marker on curve C2 in FIG. 17. All sixty of the active channels are accurately detected by the tunable optical filter scanning process (100% accuracy), showing that the proposed method and apparatus 1 works well for counting the number of optical channels within an optical transmission spectrum.

Figure 18A:
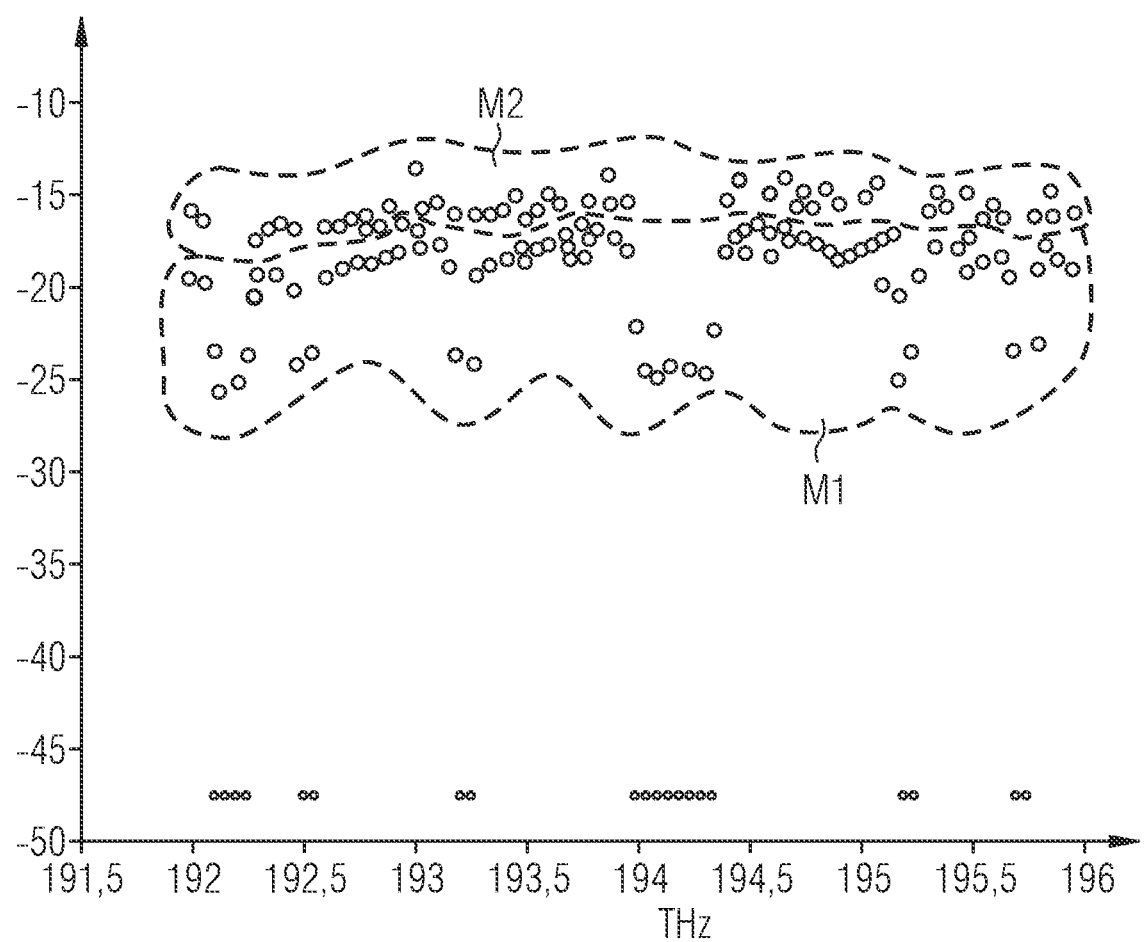
FIGS. 18A, 18B show filters scan output versus an actual power per channel and a relative channel power error to illustrate the operation of the method and apparatus according to the present invention.
Figure 18B:
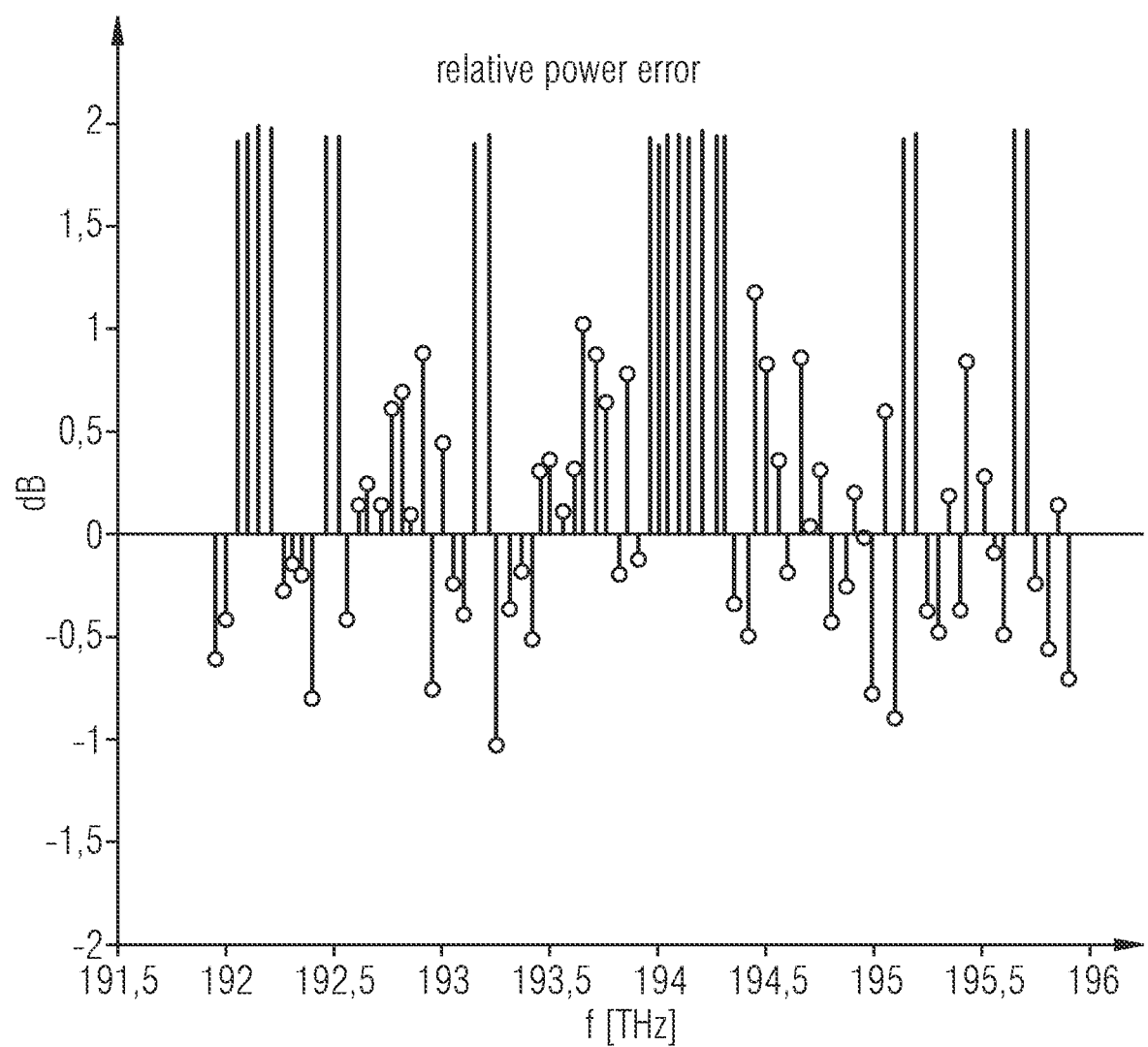

The method and apparatus 1 for performing the counting process using wider bandwidth tunable optical filters work well for counting the number of optical channels within a predetermined frequency range. FIG. 18A illustrates a filter scan output with a first group of markers M1 versus the actual power per channel with the second group of markers M2. The first group of markers M1 illustrates the channel power levels from the filter scan output wherein the actual power per channel values are illustrated by the second group markers M2. The absolute power for the missing channels (empty channel slots) is inaccurate (>20 dB error) since the wideband tunable filter 3A can pass a significant amount of power from outside the single channel slot of interest. Even taking the relative channel power error (i.e. referencing all channel power levels to the mean value), the relative power error for active channels is as large as 1.2 dB (with an average error of 0.5 dB) as illustrated in FIG. 18B. This is also primarily due to the large amount of power outside the channel of interest which is detected after passing through the tunable optical filter's wider bandwidth with many side lobes outside the central channel bandwidth.

The preceding exemplary embodiment is based on an optical channel counter implementation variant with a known/fixed channel grid, i.e. with an available channel plan. This embodiment allows the use of a wider bandwidth tunable optical filter 3A. Alternatively, a narrow bandwidth filter can also be used to detect the number of optical channels. If the shape is narrow enough the optical channel counter unit 3 can be used in a blind operation mode as also illustrated in FIG. 11. In this blind operation mode, there is now predetermined channel plan available. In any case, the apparatus 1 and method according to the present invention can be implemented with the optical channel counter unit 3 integrated inside the optical amplifier 2 or integrated in a line system. Alternatively, the optical channel counter, OCC, unit 3 can also be located externally and form a standalone device connected to amplifier monitor ports to control an open line optical system via software. Since absolute optical power measurements are not required, no power calibration is required for the optical channel counter device. This allows a much greater flexibility of implementation and placement within the optical line system. Moreover, this allows a more flexible placement of the optical channel counter, OCC, unit 3 internally within a DWDM equipment (for integrated implementation). It also enables an external use with monitor ports and fiber jumpers which may have unknown or varying loss and which cannot be easily calibrated. In this embodiment, the method and apparatus 1 according to the present invention can be used to control a disaggregated or multi-vendor open optical line system through a centralized software control mechanism.

Figure 19:
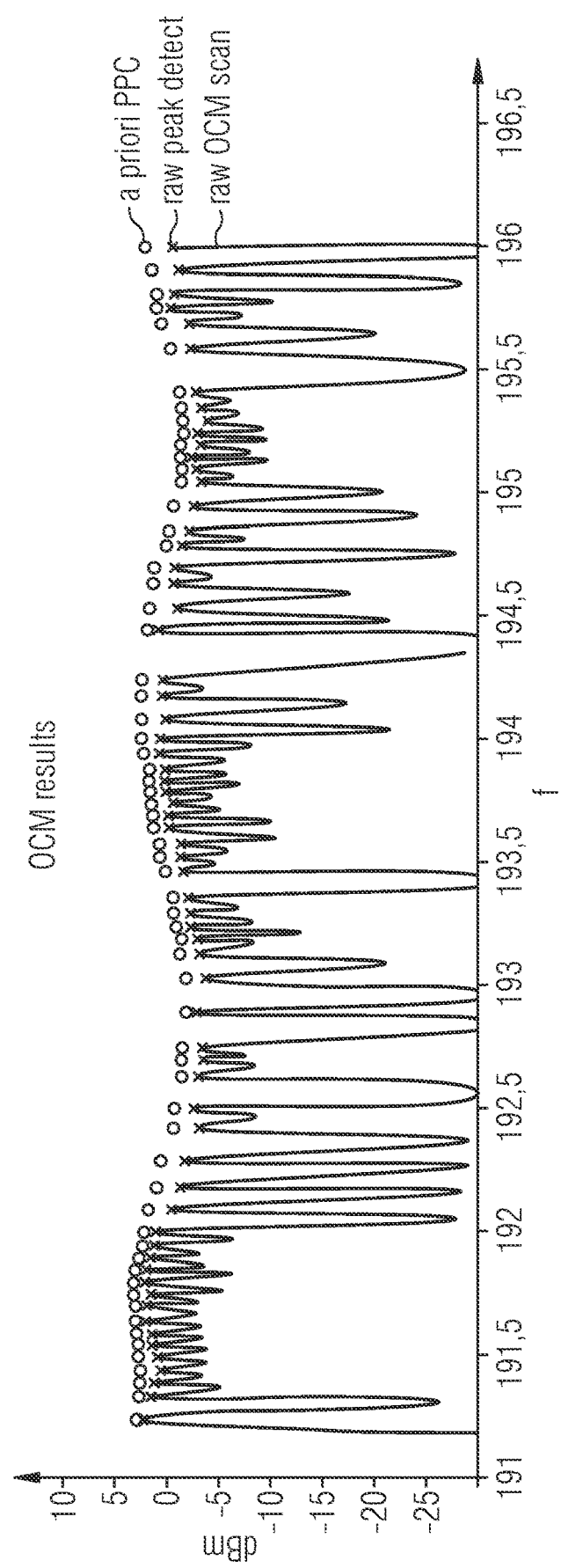
FIG. 19 shows an example of a blind channel counter operation with 50 GHz spaced channels by a method and apparatus according to the present invention.

The optical channel counter, OCC, unit 3 as shown in FIG. 2 can be operated in two different operation modes as illustrated also in the channel counter process of FIG. 11. FIG. 19 illustrates a blind channel counter operation with 50 GHz spaced channels. The blind channel detection operation mode requires the use of narrower-bandwidth tunable optical filters. In the illustrated example, the filter shape is based on a real profile of a tunable filter similar to what is currently used in a conventional OCM device, with a −3 dB bandwidth of approximately 22 GHz. In the diagram of FIG. 19, the test spectrum contains a random distribution of 10 Gb/sec, 100 Gb/sec and 200 Gb/sec channels on the standard 50 GHz grid, with some empty channel slots. The tunable filter bandwidth is roughly equal to that of the widest bandwidth signal (which has a symbol rate of 30 Gbaud). This is sufficient for the tunable optical filter scan output to accurately detect the number of optical channels without a priori knowledge of the channel distribution or spacing, i.e. without an available channel plan.

FIG. 20 illustrates a signal spectrum or a blind channel counter operation with 37.5 GHz spaced channels. In the example of 20, the signal spectrum has a random distribution of 30 Gbaud channels with root-raised cosine RRC Nyquist spectral shaping. The channels are spaced on a standard 37.5 GHz grid with some empty channel slots. The same narrower-bandwidth tunable optical filter can be used (filter bandwidth roughly equal to signal bandwidth) and in this case, an accurate detection of the total number of channels from the optical channel counter unit 3 without prior knowledge of the channel plan is provided.

Figure 3:
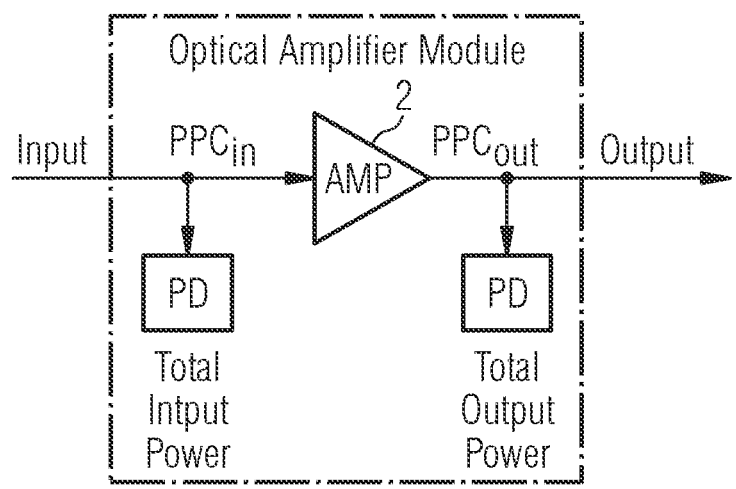
FIG. 3 shows a block diagram for illustrating a possible exemplary embodiment of an optical amplifier module according to the second aspect of the present invention.

The optical channel counter, OCC, unit 3 as illustrated in FIG. 2 can be implemented in different subsystems or modules. In a possible embodiment, the optical channel counter, OCC, unit 3 can form part of an optical amplifier module as illustrated also in FIG. 3. The invention provides according to a second aspect an optical amplifier module having an integrated optical amplifier 2 and having a gain setting apparatus 1 according to the first aspect of the present invention. The invention provides according to the second aspect an optical amplifier module comprising an optical amplifier 2 as illustrated in FIG. 3 and comprising a gain setting apparatus 1 as illustrated also in FIG. 1. The optical amplifier 2 is configured to amplify the optical input signal with a gain to generate an optical output signal. The gain setting apparatus 1 of the optical amplifier module can be configured to set automatically the gain of the respective optical amplifier 2. The gain setting apparatus 1 comprises in a possible embodiment an optical channel counter, OCC, unit 3 as illustrated in FIG. 2, a determination unit 5 and a gain adjustment unit 7 as also illustrated in the block diagram of FIG. 1. As illustrated in the embodiment of FIG. 3, the signal can be tapped both on the input side and on the output side of the optical amplifier 2. Accordingly, the tunable optical filter 3A of an optical channel counter, OCC, unit 3 can be connected to the input side or to the output side and to both input and output side of the optical amplifier 2 as also illustrated in FIG. 3. In a possible embodiment, an optical channel counter, OCC, unit 3 such as illustrated in FIG. 2 can be provided for the input and for the output side of the optical amplifier 2. In an alternative embodiment, an optical channel counter, OCC, unit 3 as shown in FIG. 2 can also be switched to the input side or to the output side of an optical amplifier 2 by an optical switching unit.

Figure 4:
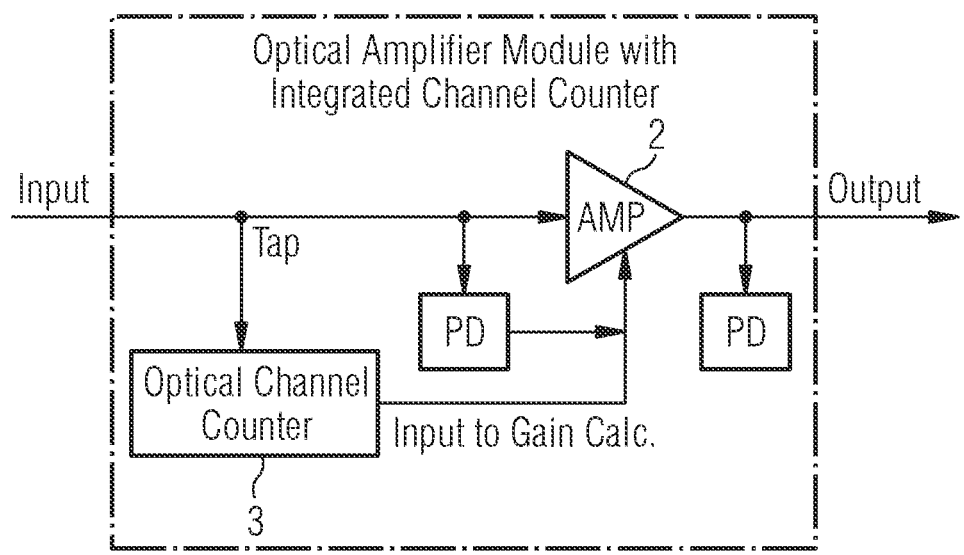
FIG. 4 shows a block diagram of a possible exemplary embodiment of an optical amplifier module according to the second aspect of the present invention.
Figure 5:
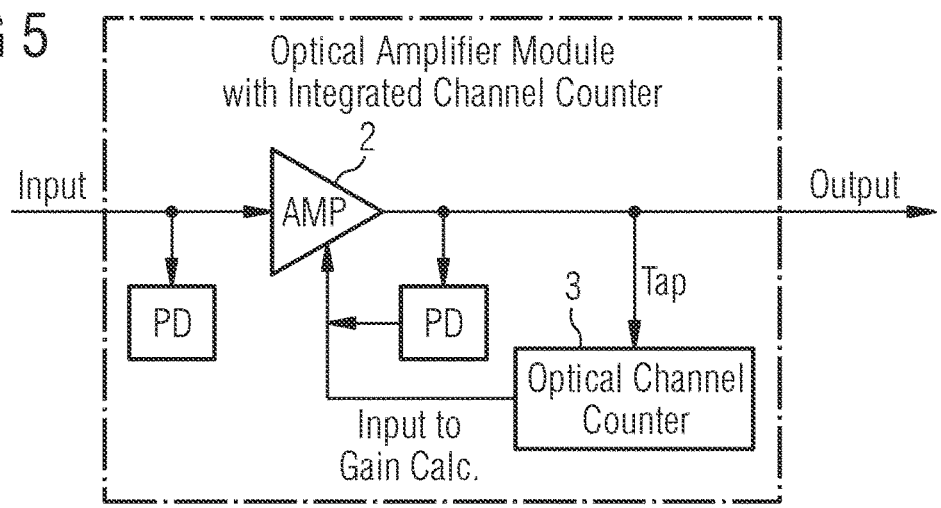
FIG. 5 shows a further block diagram of a possible exemplary embodiment of an optical amplifier module according to the second aspect of the present invention.

In a possible embodiment, the optical amplifier module can comprise an integrated optical channel, OCC, unit 3 as also illustrated in the embodiments of FIGS. 4, 5. In the embodiment of FIG. 4, the optical channel counter, OCC, unit 3 taps the input signal of the optical amplifier 2 and performs an automatic amplifier gain setting of the optical amplifier 2 as illustrated in FIG. 4.

In contrast, in the embodiment of FIG. 5, the optical amplifier module comprises an integrated channel counter unit 3 which taps the signal at the output side of the optical amplifier to perform an automatic amplifier gain setting of this optical amplifier 2.

Figure 6:
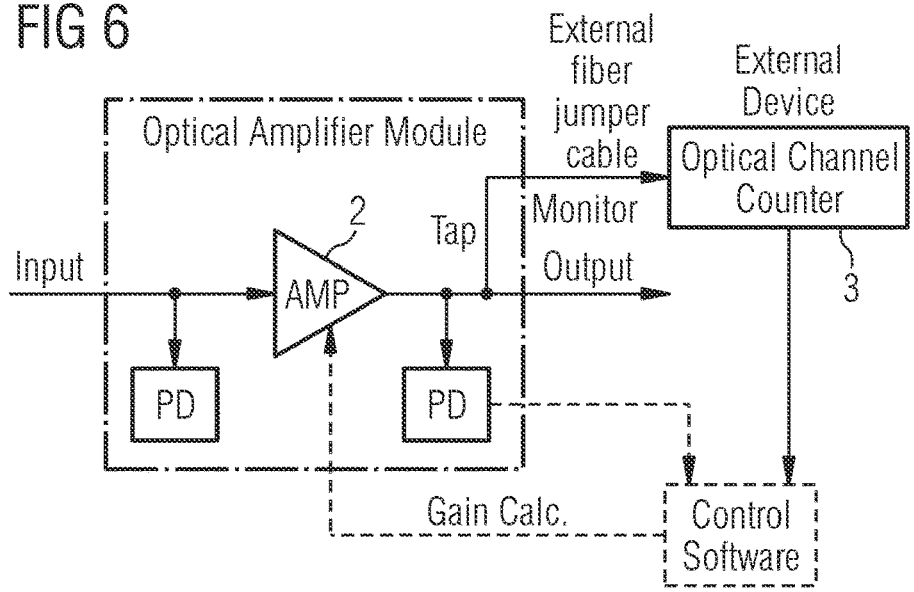
FIG. 6 shows a block diagram of a further possible exemplary embodiment of an optical amplifier module according to the second aspect of the present invention.

FIG. 6 illustrates a further possible exemplary embodiment of an optical amplifier module where the optical signal amplified by the optical amplifier 2 is tapped at the output side of the optical amplifier 2 and supplied to an external standalone optical channel counter unit 3. The optical channel counter unit 3 can be connected to the optical amplifier module by means of an external fiber jumper cable. In a possible embodiment, the optical channel counter unit 3 formed by an external device can perform an automatic setting of the amplifier gain by means of a control software as also illustrated in FIG. 6.

Figure 10:
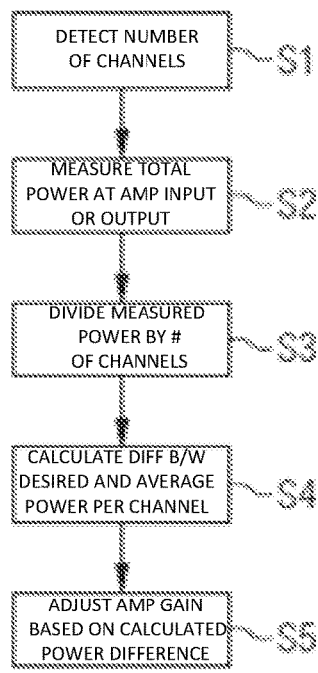
FIG. 10 shows a flowchart of a possible exemplary embodiment of a method for performing an automatic setting of an amplifier gain of an optical amplifier according to the fourth aspect of the present invention.

FIG. 10 shows a flowchart of a possible exemplary embodiment of a method for performing an automatic setting of an amplifier gain of an optical amplifier according to the fourth aspect of the present invention. The method includes, in step S1, detecting a number of channels present in an optical transmission spectrum using a tunable wide bandwidth optical filter. In step S2, the method includes measuring a total power at a signal input and/or at a signal output of the optical amplifier. In step S3, the method includes dividing the measured total power by the detected number of channels present in the optical transmission spectrum to calculate an average power per channel. In step S4, the method includes calculating a power difference between a predetermined desired power per channel and the calculated average power per channel. In step S5, the method includes adjusting the amplifier gain of the optical amplifier depending on the calculated power difference.

Figure 7:
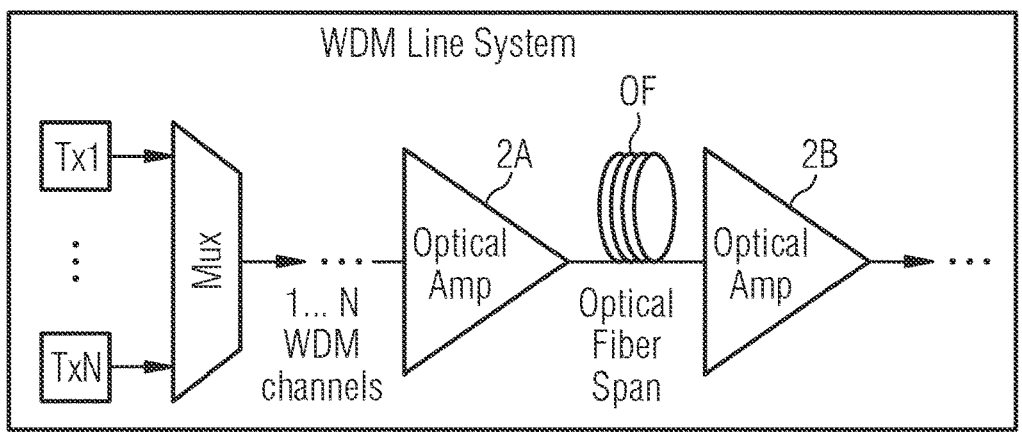
FIG. 7 shows a block diagram of a possible exemplary embodiment of a multispan line system according to the third aspect of the present invention.
Figure 8:
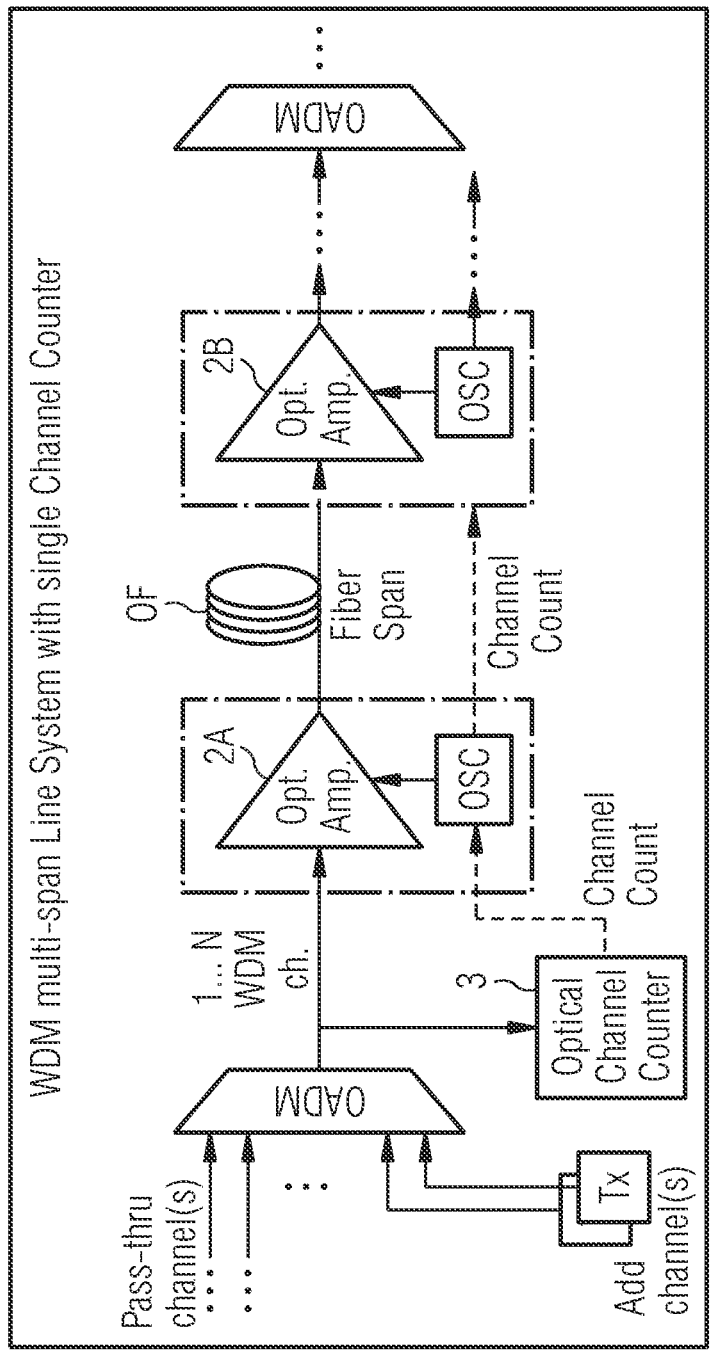
FIG. 8 shows a block diagram of a possible exemplary embodiment of a multispan line system according to the third aspect of the present invention.
Figure 9:
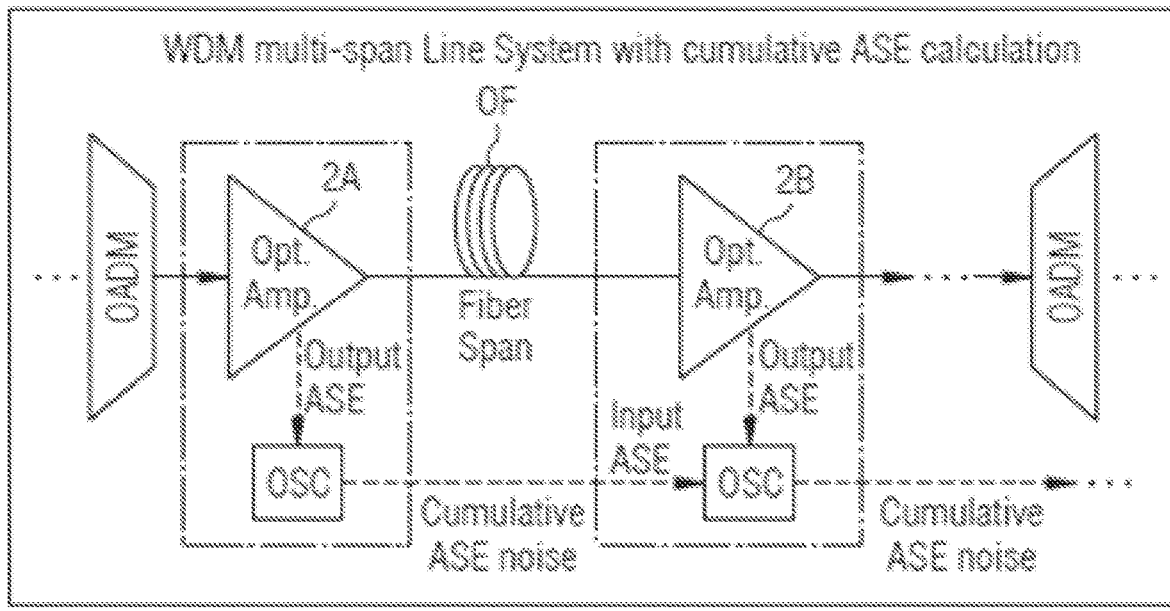
FIG. 9 shows a block diagram of a further possible exemplary embodiment of a multispan line system according to the third aspect of the present invention.

In a further possible embodiment, the optical channel counter unit 3 can also be used in a multispan optical line system as illustrated in the diagrams of FIGS. 7,8,9. FIG. 8 shows a WDM multispan optical line system comprising an optical channel counter, OCC, unit 3 used for performing an automatic gain setting of optical amplifiers 2A, 2B of the WDM multispan line system as shown in FIG. 8. As illustrated in FIG. 8, the output of the first optical amplifier 2A can be connected via an optical fiber span OF to the input of a remote second optical amplifier 2B. the input of the first optical amplifier 2A is connective to the output of an optical add/drop multiplexer OADM. The output of the second optical amplifier 2B is connected to a further optical add/drop multiplexer OADM as shown in FIG. 8. The multispan line optical system shown in FIG. 8 comprises cascaded optical amplifiers 2A, 2B which are connected to each other via the optical fiber span OF. the optical channel counter, OCC, unit 3 is configured to detect a number of channels present in an optical transmission spectrum of the multispan line system using a tunable wide bandwidth optical filter. In the illustrated embodiment of FIG. 8, the optical channel counter, OCC, unit 3 taps the optical signal at the input of the first optical amplifier 2A. The detected number of channels can be communicated by the optical channel counter, OCC, unit 3 via an optical supervisory channel OSC to the cascaded optical amplifiers 2A, 2B of the multispan line system as shown in FIG. 8. In a possible embodiment, each cascaded amplifier 2A, 2B of the multispan line system can comprise a determination unit configured to determine an average power per channel calculated by dividing a measured total power of a signal input and/or signal output of the optical amplifier 2 by the number of channels detected by the optical channel counter, OCC, unit 3 communicated via the optical supervisory channel OSC as illustrated in FIG. 8. The cascaded amplifier 2A, 2B can also comprise a gain adjustment unit 7 which is configured to adjust the respective amplifier gain of the optical amplifier automatically depending on a calculated power difference between a predetermined desired power per channel and the determined average power per channel provided by the determination unit 5 of the cascaded optical amplifier 2A, 2B.

Figure 12:
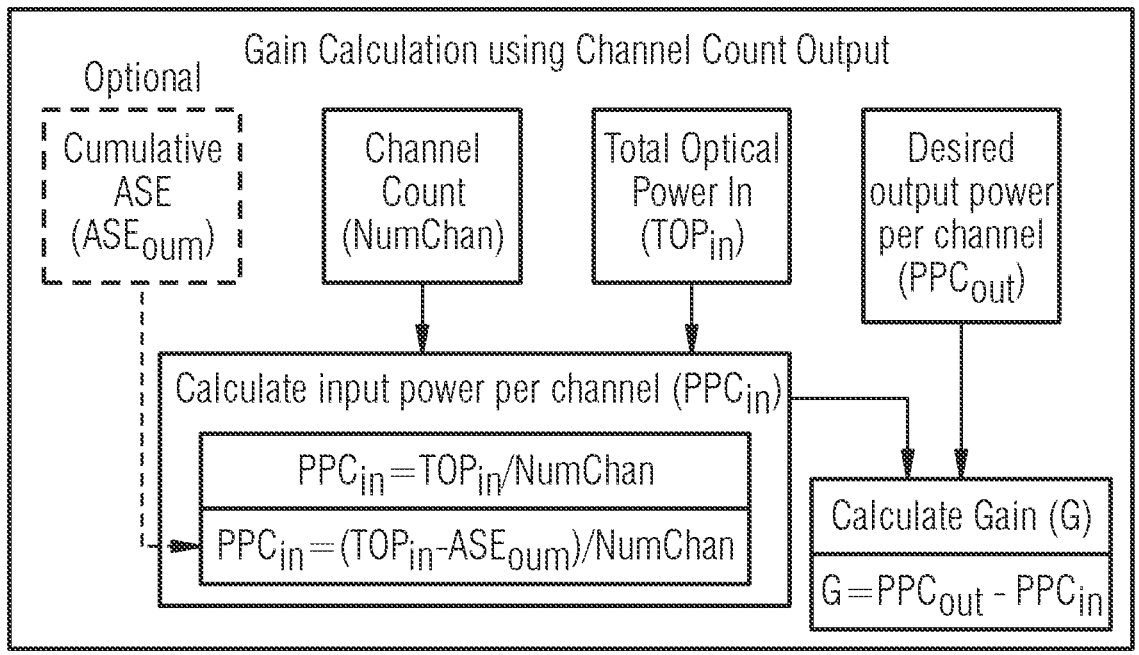
FIG. 12 shows a diagram for illustrating a gain calculation using a channel count output provided by the channel counter process illustrated in FIG. 11.

A possible embodiment of the multispan line system according to the third aspect of the present invention is illustrated in FIG. 9. In the illustrated embodiment of FIG. 9, an amplified spontaneous emission, ASE, power generated by each cascaded optical amplifier 2A, 2B of the multispan line system is tracked and summed up to determine a cumulative amplified spontaneous emission ASE of the cascaded optical amplifiers 2A, 2B. In a possible embodiment, the cumulative amplified spontaneous emission ASE of the cascaded optical amplifiers 2A, 2B can be subtracted from a measured total power to determine a total power of the optical channels. In a possible embodiment, the determined total power of the optical channels is divided by the number of optical channels present in the optical transmission spectrum of the multispan line system provided by an optical channel counter, OCC, unit 3 to calculate the average power per channel in the multispan line system. The multispan line system is in a possible embodiment a wavelength division multiplexed, WDM, multispan line system comprising a plurality of WDM channels in a predetermined frequency band. In the system illustrated in FIG. 9, the amplified spontaneous emission ASE power generated at each amplifier is tracked and then the total ASE power is subtracted from the detected total optical power to accurately determine the power of only the optical signals and/or channels. Finally, the required gain of the optical amplifier 2 is calculated by taking the difference between the desired output power per channel and the calculated average input power per channel (total optical channel power divided by the detected number of optical channels). Furthermore, in the multispan system comprising cascaded amplifiers 2A, 2B, a detected channel count can be communicated via an optical supervisory channel OSC to other optical amplifiers 2 along the optical fiber link between add/drop nodes as illustrated in the embodiment of FIG. 8. This allows the same procedure for automatic setting of average power per channel to be executed at other inline amplifier locations in the absence of any optical channel counter device. FIG. 12 illustrates the gain calculation using a channel count output of an optical counter unit 3. On the basis of the channel count provided by the optical channel counter unit 3 and the measured or known total optical power, it is possible to calculate input power per channel $PPC_{in}$ as shown in the diagram of FIG. 12. This calculated input power per channel $PPC_{in}$ can be used to calculate the amplifier gain using the desired output power per channel $PPC_{out}$. The gain can be calculated as the difference between the desired output power per channel and the calculated input power per channel as shown in FIG. 12. Optionally, the input power per channel $PPC_{in}$ can also be calculated taking into account the cumulative amplified spontaneous emission power ASE as illustrated in the diagram of FIG. 12.

Figure 13:
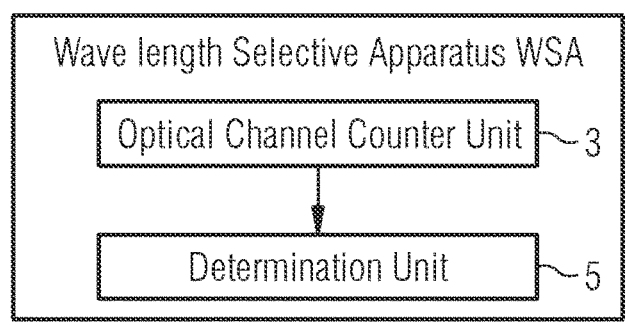
FIG. 13 shows a block diagram of a possible exemplary embodiment of a wavelength selective apparatus according to the fifth aspect of the present invention.

FIG. 13 shows a block diagram of a wavelength selective apparatus WSA according to a fifth aspect of the present invention. The wavelength selective apparatus WSA comprises in the illustrated embodiment of FIG. 13 an optical channel counter unit 3 and a determination unit 5. The optical channel counter unit 3 is configured to detect a number of channels present in an optical transmission spectrum using a tunable wide bandwidth optical filter. The optical channel counter unit 3 can comprise in a possible embodiment a tunable optical filter 3A, a photodetector 3B and a processing unit 3C as illustrated in the embodiment of FIG. 2. The determination unit 5 of the wavelength selective apparatus WSA is configured to determine whether a signal power at ports of the wavelength selective apparatus WSA does meet predetermined thresholds on the basis of the number of channels detected by the optical channel counter, OCC, unit 3. The wavelength selective apparatus WSA can comprise one or several input ports as well as one or several output ports. In a possible embodiment, the optical channel counter unit 3 and the determination unit 5 can be co-packaged with a passive filter and/or demultiplexer or any other kind of wavelength selective apparatus. In a possible embodiment, the determination unit 5 of the wavelength selective apparatus WSA can be configured to determine whether a signal power of ports of the wavelength selective apparatus WSA meets predetermined threshold values on the basis of a measured total signal power within a predefined optical transmission spectrum. In a possible embodiment, the determination unit 5 is adapted to determine whether the signal power of one of the ports of the wavelength selective apparatus WSA does not exceed a predetermined safety optical power threshold. In a possible embodiment, this predetermined safety power threshold can be a threshold to provide eye safety to a user. In a possible embodiment of the wavelength selective apparatus WSA according to the fifth aspect of the present invention, a signal power at one or more ports of the wavelength selective apparatus WSA can be automatically adjusted to meet predetermined signal power thresholds at the respective ports of the wavelength selective apparatus WSA. The wavelength selective apparatus WSA can be a passive device. In this case other connected devices such as optical amplifiers or attenuators can be used to track and control the power levels into and out of the wavelength selective apparatus WSA. If the detected power levels are too low or too high with respect to a predetermined threshold or criterion an automatic adaptation of the signal power levels can be performed. In many cases, optical amplifiers are designed with built-in photodiodes for monitoring a total input/output power as also illustrated in the embodiment of FIG. 3. A laser eye safety mechanism can be implemented using an optical channel counter unit 3 and a determination unit 5 to limit the total power output by an optical amplifier 2 if it exceeds a predefined limit. While this is more straightforward for active elements in an optical system which can be disabled or block light, this approach can also be applied to passive elements such as optical filters, e.g. commonly used arrayed waveguide grating multiplexers/demultiplexers. In some use cases, it is important to know how the aggregate power into or out of a certain network element is distributed across an optical spectrum to determine whether the power input into the passive wavelength selective apparatus WSA or output by the passive wavelength selective apparatus WSA such as a multiplexer/demultiplexer does exceed a predefined power threshold such as an eye safety power threshold. For example, a passive optical filter with a loss of 3 dB may receive a total input power of 25 dBm. If this input power is all concentrated in a spectral region for one output port of the passive optical filter, then the total output power can be +22 dBm (25 dBm input−3 dB loss) which exceeds a class 1M eye safety threshold. Instead, if the total input power is spread across multiple wavelengths throughout the optical spectrum and is thus divided across multiple output ports of the passive optical filter, then the total output of any single output port of the optical filter is below the predefined eye safety threshold, since the total power is divided across multiple wavelength selective output ports of the wavelength selective apparatus WSA as shown in FIG. 13. In this embodiment, the optical channel counter unit 3 can be used to determine whether a given configuration is valid for meeting a predefined requirement or condition, in particular whether the configuration is valid for eye safety requirements when active optical elements such as optical amplifiers or transceivers are used in conjunction with passive devices such as multiplexer/demultiplexer filters. By counting the number of optical channels or determining a distribution of the total optical power across the transmission spectrum, the determination unit 5 can be configured to determine whether a given configuration meets predefined power thresholds, in particular eye safety thresholds or if power levels must be automatically reduced, for example at an optical amplifier, to meet the respective power limit or eye safety standard. Furthermore, since the optical channel counter unit 3 comprises a tunable filter device, the scanning/processing time can be very fast allowing the determination of possible input/output power levels within acceptable quick time windows to meet the predefined power threshold, in particular the required eye safety criteria. The optical channel counter unit 3 can be used in a possible embodiment to assist with meeting predefined power standards such as eye safety standards. The optical channel counter unit 3 can be used in multiple implementation configurations including as an internal element built into an existing active equipment such as an optical amplifier 2 as also illustrated in the embodiment of FIG. 4. The optical channel counter unit 3 can also be built into existing active equipment such as an optical amplifier as illustrated in the embodiments of FIGS. 4, 5. Moreover, the optical channel counter unit 3 can also be an external device connected to a monitor port of an optical amplifier 2 as illustrated in the embodiment of FIG. 6. Moreover, the optical channel counter unit 3 can also be connected to an input/output port of an active or passive optical add/drop multiplexer/demultiplexer as illustrated in the embodiment of FIG. 8. There are also multiple implementation variants as to how such an optical channel counter unit 3 can be placed in a node with passive elements and how it can be used in a control scheme to ensure predefined power thresholds or standards.

Figure 14A:
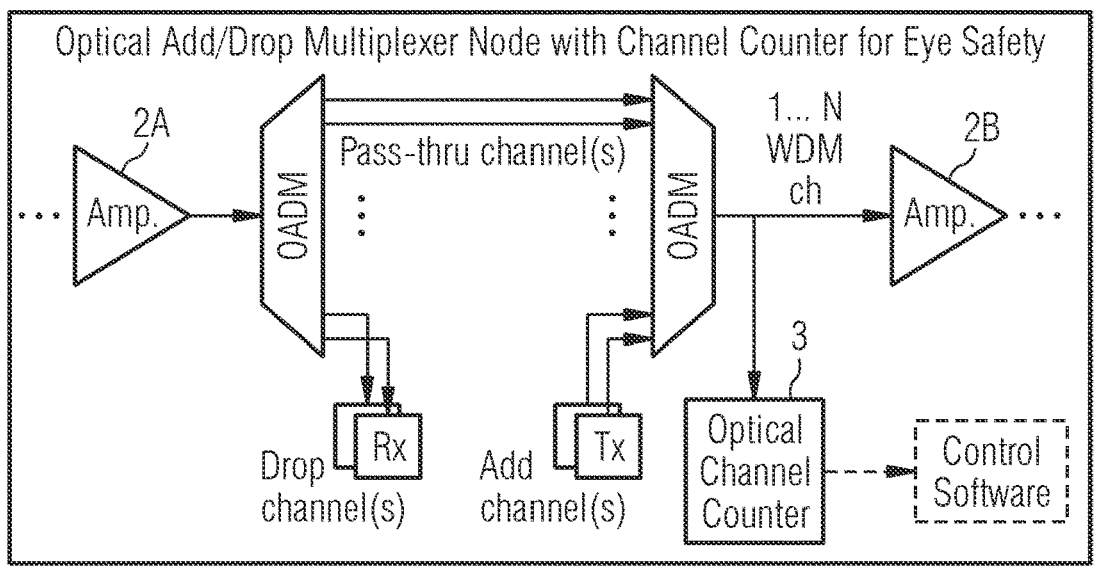
FIG. 14A, 14B show a block diagrams of a possible exemplary embodiments of the wavelength selective apparatus illustrated in FIG. 13.
Figure 14B:
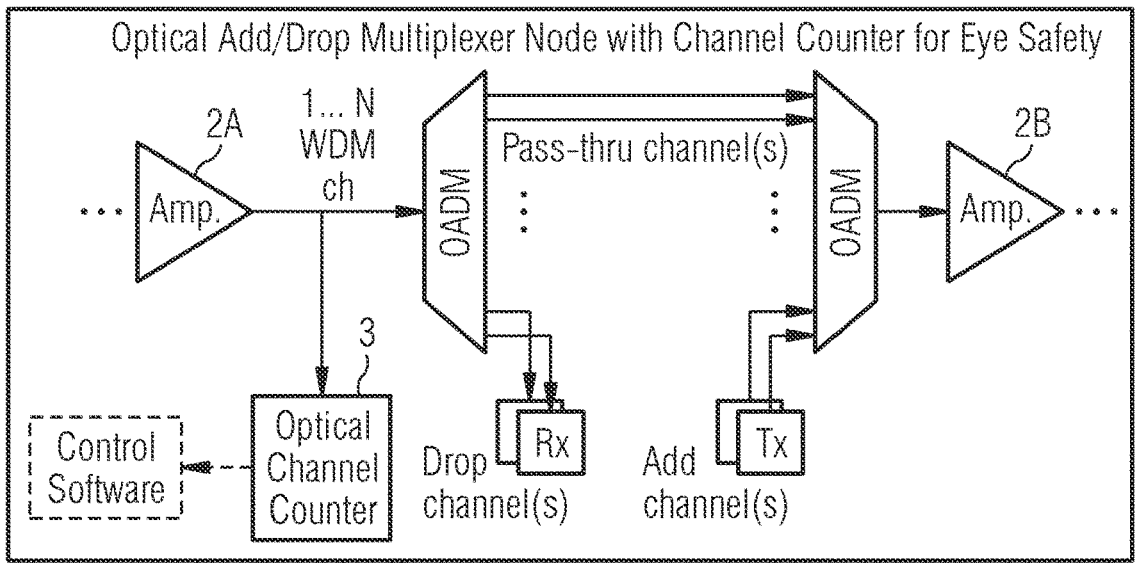

FIGS. 14A, 14B illustrate a possible exemplary embodiments of an optical add/drop multiplexer node with an optical channel counter unit 3 used to meet an eye safety power threshold. The OADM node illustrated in FIGS. 14A, 14B contains active amplifiers 2A, 2B and transceivers (Tx/Rx) which can be actively controlled and passive elements such as OADMs formed by passive optical filters. These can be used to split and combine multiple WDM channels in a wavelength selective way. Since these channels may pass through from another degree or another OADM in the same node or may terminate/originate at a transceiver (add/drop), the aggregate power levels in and out of the OADMs can depend on the power levels into and out of the amplifiers and transceivers as well as on the number of channels (i.e. the spectral distribution of the total optical power). The total optical power can be measured using photodiodes which are commonly included in active equipment. The optical channel counter unit 3 can be used in this embodiment to ensure that the channel count/distribution is configured in such a way that no port in or out of the OADM violates predefined eye safety limits. In a possible embodiment, this involves some coordination via control software as also illustrated in the embodiments of FIGS. 14A, 14B.

Figure 15:
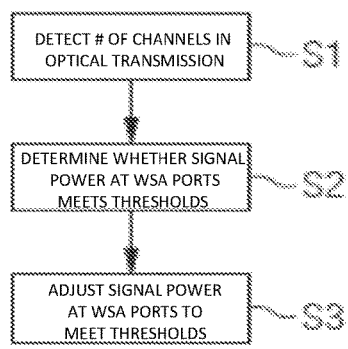
FIG. 15 shows a possible exemplary embodiment of a method for automatic adjustment of signal power according to the sixth aspect of the present invention.

FIG. 15 shows a flowchart of a possible exemplary embodiment of a method for automatic adjustment of signal power according to a sixth aspect of the present invention. The method illustrated in FIG. 15 is used for automatic adjustment of signal power of at least one port of a wavelength selective apparatus such as the wavelength selective apparatus WSA illustrated in FIG. 13. In a first step S1, the number of channels present in an optical transmission spectrum can be detected by an optical channel counter, OCC, unit 3 using a tunable wide bandwidth optical filter. In a further step S2, it is determined whether a signal power at the ports of the wavelength selective apparatus WSA does meet predetermined power thresholds on the basis of the detected number of channels within the optical transmission spectrum and on the basis of a measured total signal power within the optical transmission spectrum. Finally, in step S3, the signal power at the ports of the wavelength selective apparatus WSA are adjusted until the signal power of the signals at the ports does meet the predefined power thresholds such as eye safety standards. The signal power adjustment can be performed by external devices if the wavelength selective apparatus is a passive apparatus or filter.

As illustrated in the diagram of FIG. 11, a channel counter process performed by the optical channel counter unit 3 can be performed with a predetermined known channel plan or without such a channel plan. In the applied operation mode, where no channel plan is available, the raw measured spectrum which can be measured from a tunable filter scan can be analyzed by a peak detection algorithm. The peak detection algorithm allows for detection of channels with arbitrary spectral width and spacing between the channels. Different variants of general peak detection algorithms can be applied to the measured spectral data. In general, the peak detection can be performed by taking a first derivative of the spectral data and looking for positive-to-negative zero crossings to find peaks. In order to avoid false-positive peak detection due to noisy/non-uniform real data, some smoothing or averaging can be applied in a possible implementation. In a possible embodiment, a certain slope/amplitude threshold is applied to correctly identify channel peaks and to avoid false positives which are too small, too narrow, or too wide to be an actual peak of a channel.

The method and apparatus 1 according to the present invention allows the use of a tunable filter device within an optical channel counter unit 3 to detect the number of optical channel present in the respective system. The channel count information can be used with standard total power photodetector readings of the optical amplifiers 2 to automatically set the amplifier gain to achieve a desired output power per channel. In a possible embodiment, an automatic gain setting of an optical amplifier 2 can be provided using a small footprint optical channel counter unit 3. The optical channel counter unit 3 does not rely on absolute per channel power readings and thus the device does not require calibration for accurately detecting absolute optical power levels. This relaxed calibration requirement simplifies the design and manufacturing of the apparatus 1 according to the present invention. This also makes the device more robust to temperature and ageing effects which may cause variations in the tunable filter performance over time, since the method and apparatus 1 according to the present invention are only based on relative measurements at a given point in time. Since all power measurements used by the method and apparatus 1 according to the present invention are relative, the precise loss values of any taps and/or fiber jumpers connecting the apparatus 1 according to the present invention to a line system are irrelevant which allows for greater flexibility in placement of the optical channel counter unit 3 within the system. The optical channel counter unit 3 can be implemented internally, i.e. built into the line system, providing optimal integration and ease of communication between various system elements. Alternatively, the optical channel counter unit 3 can be implemented externally as a standalone device with a software control for use with an open line system including multi-vendor systems.

In a possible embodiment, a predetermined channel plan is available which provides for relaxed requirements on both the tunable filter bandwidth and the isolation/rejection outside the filter bandwidth. The reason for this is that the channel plan requires only a coarse spectral scan for detecting the presence or absence of a channel but not the actual channel power levels. This allows for a greater flexibility in design of the system since a variety of tunable filter technologies can be used because the filter bandwidth/shape requirements are less stringent. The implementation of the channel counter process using a predefined channel plan can also operate very fast since a full spectral scan must not be performed (with small frequency granularity) but only a simple coarse scan is sufficient to detect the presence or absence of each optical channel. The optical channel counter unit 3 can consist in a possible embodiment of a tunable filter 3A, a photodetector 3A and a processing unit 3C as illustrated in FIG. 2. The optical channel counter unit 3 is used to detect the number of optical channels (wavelengths) present in the optical system. This channel count information is then used in a possible embodiment to automatically set and/or control amplifier gain levels of optical amplifiers 2. This can be accomplished by taking the total power measured by standard photodetectors at the input side and/or output side of amplifiers and by dividing the total power by the detected number of channels to calculate the average power per channel. The amplifier gain is then set to achieve the desired output power per channel.

In an alternative embodiment, the channel grid spacing or channel plan is unknown or variable and the optical channel counter unit 3 works in the blind fashion operation mode as illustrated in FIG. 11 to detect the number of channels. In the alternative embodiment, the channel grid spacing or channel plan is known or fixed and the optical channel counter unit 3 does detect the number of channels within this known fixed channel plan. Requirements of the tunable filter within the optical channel counter unit 3 can vary depending on which of the previous implementations is used. The embodiment with a fixed available channel plan places released strict requirements on the bandwidth and shape of the tunable optical filter and is also compatible with many systems including those based on fixed grid multiplexer/demultiplexer devices. Additional variants can relate to the location of the optical channel counter unit 3. The optical channel counter unit 3 can be built into or used with all amplifiers or only on one amplifier within a network segment between add/drop locations wherein the detected channel count result is communicated to other nodes, for instance via an optical supervisory channel OSC as also illustrated in FIG. 8.

The method and system according to the present invention comprises several key advantages. There are relaxed requirements for the tunable filter device compared to conventional OCM tunable filters. Both the filter bandwidth and the required isolation/rejection outside the central filter bandwidth are not as strictly limited in the method and apparatus 1 according to the present invention in comparison to a conventional OCM. This is because the filter scan output is only required to detect the presence or absence of a channel rather than the absolute optical power per channel.

The method and apparatus 1 according to the present invention allow for a simplified design on manufacturing. Flexibility to use a variety of tunable filter technologies is provided since the filter bandwidth/shape requirements are less stringent. Further, the method and apparatus 1 have relaxed calibration requirements since the apparatus 1 and method only depend on relative measurements.

The method and apparatus 1 according to the present invention is more robust to temperature and ageing effects which may cause variations in filter performance over time, since the method and apparatus 1 according to the present invention is based on relative power measurements at any given point in time.

The method and apparatus 1 further provide excellent flexibility and options for placement of the optical channel counter unit 3 and relaxed calibration requirements. Losses of any taps for an internal/integrated implementation or fiber jumpers (for an external implementation) are not relevant since all power measurements are relative.

The optical channel counter unit 3 can be implemented internally, i.e. built into a line system equipment, for optimal integration and ease-of-use or can be implemented externally as a standalone device for use with an open disaggregated line system. The method according to the present invention is fast and allows for accurate automatic amplifier gain settings which reduces the amount of required overhead communication between nodes significantly.

The invention claimed is:

1. An apparatus for automatic amplifier gain setting of an optical amplifier, said apparatus comprising:
   an optical channel counter, OCC, unit configured to detect a number of channels present in an optical transmission spectrum;
   a determination unit configured to determine an average power per channel calculated by dividing a measured total power of a signal input and/or signal output of the optical amplifier by the number of channels detected by said optical channel counter, OCC, unit; and
   a gain adjustment unit configured to adjust the amplifier gain of said optical amplifier automatically depending on a calculated power difference between a predetermined desired power per channel and the determined average power per channel provided by said determination unit,
   wherein the optical channel counter, OCC, unit is further configured to perform a channel counter process in at least one of the following two operation modes:
   in a first operation mode, a peak detection algorithm which allows for detection of channels with arbitrary spectral width and spacing between the channels is applied to determine the number of channels present in an optical transmission spectrum, and
   in a second operation mode, a channel plan concerning channel spacings between channels within the optical transmission spectrum is received to decide whether a channel is present or not at a specific channel frequency slot of the optical transmission spectrum.

2. The apparatus according to claim 1 wherein said optical channel counter, OCC, unit comprises
   a tunable wide bandwidth optical filter adapted to scan the optical transmission spectrum,
   a photodetector adapted to detect a filter output of said tunable optical filter and
   a processor adapted to process the detected filter output provided by said photodetector to count the number of channels present in the optical transmission spectrum.

3. The apparatus according to claim 2 wherein the tunable wide bandwidth optical filter has a bandwidth that is approximately the signal bandwidth and/or channel spacing between channels.

4. The apparatus according to claim 3 wherein a center frequency of the tunable wide bandwidth optical filter of said optical channel counter, OCC, unit is scanned in fixed frequency increments over the optical transmission spectrum and a filter output of the tunable wide bandwidth optical filter is detected and recorded at each frequency increment by the photodetector of said optical channel counter, OCC, unit.

5. The apparatus according to claim 1 wherein the processor of the optical channel counter, OCC, unit is adapted to integrate power within each channel frequency slot indicated in the channel plan and to compare the integrated power with a power threshold value to decide whether a channel is present or not at the respective channel frequency slot.

6. The apparatus according to claim 5 wherein the channel plan is supplied to the processor of said optical channel counter, OCC, unit before scanning of the optical transmission spectrum by the tunable optical filter of said optical channel counter, OCC, unit is initiated.

7. An optical amplifier module comprising an optical amplifier configured to amplify an optical input signal with a gain to generate an optical output signal, and
   a gain setting apparatus configured to set automatically the gain of said optical amplifier,
   said gain setting apparatus comprising:
   an optical channel counter, OCC, unit configured to detect a number of channels present in an optical transmission spectrum using a tunable wide bandwidth optical filter,
   a determination unit configured to determine an average power per channel calculated by dividing a measured total power of a signal input and/or signal output of the optical amplifier by the number of channels detected by the optical channel counter, OCC, unit and
   a gain adjustment unit configured to adjust the amplifier gain of said optical amplifier automatically depending on a calculated power difference between a predetermined desired power per channel and the determined average power per channel provided by the determination unit, wherein the optical channel counter, OCC, unit is further configured to perform a channel counter process in at least one of the following two operation modes:

in a first operation mode, a peak detection algorithm which allows for detection of channels with arbitrary spectral width and spacing between the channels is applied to determine the number of channels present in an optical transmission spectrum, and in a second operation mode, a channel plan concerning channel spacings between channels within the optical transmission spectrum is received to decide whether a channel is present or not at a specific channel frequency slot of the optical transmission spectrum.

8. A multispan line system comprising cascaded optical amplifiers connected to each other via fiber spans, said system comprising an optical channel counter, OCC, unit configured to detect a number of channels present in an optical transmission spectrum of said multispan line system using a tunable wide bandwidth optical filter, wherein the detected number of channels is communicated via an optical supervisory channel, OSC, to the cascaded optical amplifiers of the multispan line system, and wherein each cascaded amplifier of the multispan line system comprises a determination unit configured to determine an average power per channel calculated by dividing a measured total power of a signal input and/or signal output of the optical amplifier by the number of channels detected by the optical channel counter, OCC, unit communicated via the optical supervisory channel, OSC, and a gain adjustment unit configured to adjust the amplifier gain of said optical amplifier automatically depending on a calculated power difference between a predetermined desired power per channel and the determined average power per channel provided by the determination unit, wherein the optical channel counter, OCC, unit is further configured to perform a channel counter process in at least one of the following two operation modes:

in a first operation mode, a peak detection algorithm which allows for detection of channels with arbitrary spectral width and spacing between the channels is applied to determine the number of channels present in an optical transmission spectrum, and in a second operation mode, a channel plan concerning channel spacings between channels within the optical transmission spectrum is received to decide whether a channel is present or not at a specific channel frequency slot of the optical transmission spectrum.

9. The multispan line system according to claim 8 wherein an amplified spontaneous emission, ASE, power generated by each cascaded optical amplifier of the multispan line system is tracked and summed up to determine a cumulative amplified spontaneous emission, ASE, of the cascaded optical amplifiers.

10. The multispan line system according to claim 9 wherein the cumulative amplified spontaneous emission, ASE, of the cascaded optical amplifiers is subtracted from a measured total power to determine a total power of the optical channels.

11. The multispan line system according to claim 10 wherein the determined total power of the optical channels is divided by the number of optical channels present in the optical transmission spectrum of the multispan line system provided by the optical channel counter, OCC, unit to calculate the average power per channel in said multispan line system.

12. The multispan line system according to claim 8 wherein the multispan line system is a wavelength division multiplexed, WDM, multispan line system comprising a plurality of WDM channels in a predetermined frequency band.

13. A method for performing automatic setting of an amplifier gain of an optical amplifier, the method comprising the steps of:

detecting a number of channels present in an optical transmission spectrum using a tunable wide bandwidth optical filter;

measuring a total power at a signal input and/or at a signal output of the optical amplifier;

dividing the measured total power by the detected number of channels present in the optical transmission spectrum to calculate an average power per channel;

calculating a power difference between a predetermined desired power per channel and the calculated average power per channel; and adjusting the amplifier gain of the optical amplifier depending on the calculated power difference, wherein the step of detecting a number of channels present in an optical transmission spectrum using a tunable wide bandwidth optical filter comprises:

applying a peak detection algorithm which allows for detection of channels with arbitrary spectral width and spacing between the channels to determine the number of channels present in an optical transmission spectrum, and/or receiving a channel plan concerning channel spacings between channels within the optical transmission spectrum to decide whether a channel is present or not at a specific channel frequency slot of the optical transmission spectrum.

14. The method according to claim 13 wherein a center frequency of the tunable wide bandwidth optical filter is scanned in fixed frequency increments over the optical transmission spectrum and a filter output of said wide bandwidth optical filter is detected and recorded at each frequency increment.

15. The method according to claim 14 wherein the detected filter output of said wide bandwidth optical filter is processed by a processor to count the number of channels present in the optical transmission spectrum.

16. The method according to claim 15 wherein the processor is adapted to integrate power within each channel frequency slot indicated in a channel plan and to compare the integrated power with a power threshold value to decide whether a channel is present or not at the respective channel frequency slot.

17. The method according to claim 16 wherein the channel plan is supplied to the processor before scanning of the optical transmission spectrum by the tunable optical filter is initiated.

18. A wavelength selective apparatus comprising an optical channel counter, OCC, unit configured to detect a number of channels present in an optical transmission spectrum using a tunable wide bandwidth optical filter; and a determination unit configured to calculate an average signal power at ports of said wavelength selective apparatus based on a total power measurement and the number of channels detected by said optical channel counter, OCC, unit and to determine whether an average signal power on a given port of said wavelength selective apparatus meets predetermined thresholds on the basis of a measured total signal power within a predefined optical transmission spectrum, wherein the determination unit is further configured to determine whether a signal power at one of the ports of said wavelength selective apparatus does not exceed a predetermined safety power threshold, and wherein a signal power at one or more ports of the wavelength selective apparatus is automatically adjusted by a connected external device or by the wavelength selective apparatus itself to meet predetermined signal power thresholds at the respective ports of said wavelength selective apparatus, wherein the optical channel counter, OCC, unit is further configured to perform a channel counter process in at least one of the following two operation modes:

in a first operation mode, a peak detection algorithm which allows for detection of channels with arbitrary spectral width and spacing between the channels is applied to determine the number of channels present in an optical transmission spectrum, and in a second operation mode, a channel plan concerning channel spacings between channels within the optical transmission spectrum is received to decide whether a channel is present or not at a specific channel frequency slot of the optical transmission spectrum.

19. A method for automatic adjustment of signal power at one or more ports of a wavelength selective apparatus, the method comprising the steps of:

detecting a number of channels present in an optical transmission spectrum by an optical channel counter, OCC, unit using a tunable wide bandwidth optical filter;

determining whether an average signal power at the ports of the wavelength selective apparatus does meet predetermined power thresholds on the basis of the detected number of channels within the optical transmission spectrum and a measured total signal power within the optical transmission spectrum; and adjusting the signal power at the ports of the wavelength selective apparatus until the signal power of the signal at the ports does meet the predetermined power thresholds, wherein the step of detecting a number of channels present in an optical transmission spectrum by an optical channel counter, OCC, unit using a tunable wide bandwidth optical filter comprises:

applying a peak detection algorithm which allows for detection of channels with arbitrary spectral width and spacing between the channels to determine the number of channels present in an optical transmission spectrum, and/or receiving a channel plan concerning channel spacings between channels within the optical transmission spectrum to decide whether a channel is present or not at a specific channel frequency slot of the optical transmission spectrum.

* * * * *